United States Patent
Palmateer et al.

(10) Patent No.: US 7,573,547 B2
(45) Date of Patent: Aug. 11, 2009

(54) SYSTEM AND METHOD FOR PROTECTING MICRO-STRUCTURE OF DISPLAY ARRAY USING SPACERS IN GAP WITHIN DISPLAY DEVICE

(75) Inventors: Lauren Palmateer, San Francisco, CA (US); William J. Cummings, San Francisco, CA (US); Brian Gally, San Rafael, CA (US); Clarence Chui, San Mateo, CA (US)

(73) Assignee: IDC, LLC, San Francisco, CA (US)

( * ) Notice: Subject to any disclaimer, the term of this patent is extended or adjusted under 35 U.S.C. 154(b) by 792 days.

(21) Appl. No.: 11/108,026

(22) Filed: Apr. 15, 2005

(65) Prior Publication Data

US 2006/0077147 A1 Apr. 13, 2006

Related U.S. Application Data

(60) Provisional application No. 60/613,682, filed on Sep. 27, 2004, provisional application No. 60/613,406, filed on Sep. 27, 2004.

(51) Int. Cl.
*G02F 1/1335* (2006.01)
(52) U.S. Cl. .................................. 349/106
(58) Field of Classification Search ............... None
See application file for complete search history.

(56) References Cited

U.S. PATENT DOCUMENTS

| | | |
|---|---|---|
| 4,074,480 A | 2/1978 | Burton |
| 4,310,220 A | 1/1982 | Kuwagaki et al. |
| 4,383,255 A | 5/1983 | Grandjean et al. |
| 4,459,182 A | 7/1984 | te Velde |
| 4,956,619 A | 9/1990 | Hornbeck |
| 5,018,256 A | 5/1991 | Hornbeck |
| 5,099,353 A | 3/1992 | Hornbeck |

(Continued)

FOREIGN PATENT DOCUMENTS

EP 0 667 548 8/1995

(Continued)

OTHER PUBLICATIONS

MILES, MEMS-based interferometric modulator for display applications, Proceedings of the SPIE, Micromachined Devices and Components, V, Sep. 1999, pp. 20-28.

(Continued)

*Primary Examiner*—Sung H Pak
(74) *Attorney, Agent, or Firm*—Knobbe, Martens, Olson & Bear, LLP

(57) ABSTRACT

Physical forces sufficient to deform an electronic device and/or packaging for the electronic device can damage the device. Some mechanical components in a device, for example, in a microelectromechanical device and/or in an interferometric modulator are particularly susceptible to damage. Accordingly, provided herein is a packaging system and packaged electronic device that resists physical damage, a method for manufacturing the same, and a method for protecting an electronic device from physical damage. The packaging system for the electronic device includes one or more spacers that prevent or reduce damage to the electronic device arising from contact with the packaging. In some embodiments, the packaged electronic device comprising spacers is thinner than a comparable device manufactured without spacers.

33 Claims, 27 Drawing Sheets

U.S. PATENT DOCUMENTS

| | | |
|---|---|---|
| 5,216,537 A | 6/1993 | Hornbeck |
| 5,244,707 A | 9/1993 | Shores |
| 5,268,533 A | 12/1993 | Kovacs et al. |
| 5,331,454 A | 7/1994 | Hornbeck |
| 5,401,983 A | 3/1995 | Jokerst et al. |
| 5,717,476 A | 2/1998 | Kanezawa |
| 5,771,321 A | 6/1998 | Stern |
| 5,784,189 A | 7/1998 | Bozler et al. |
| 5,835,255 A | 11/1998 | Miles |
| 5,853,662 A | 12/1998 | Watanabe |
| 5,856,820 A | 1/1999 | Weigers et al. |
| 5,936,758 A | 8/1999 | Fisher et al. |
| 5,939,785 A | 8/1999 | Klonis et al. |
| 5,959,763 A | 9/1999 | Bozler et al. |
| 5,986,796 A | 11/1999 | Miles |
| 5,999,306 A | 12/1999 | Atobe et al. |
| 6,040,937 A | 3/2000 | Miles |
| 6,055,090 A | 4/2000 | Miles |
| 6,107,115 A | 8/2000 | Atobe et al. |
| 6,120,339 A | 9/2000 | Alwan |
| 6,127,765 A | 10/2000 | Fushinobu |
| 6,195,196 B1 | 2/2001 | Kimura et al. |
| 6,238,755 B1 | 5/2001 | Harvey et al. |
| 6,303,986 B1 | 10/2001 | Shook |
| 6,365,229 B1 | 4/2002 | Robbins |
| 6,379,988 B1 | 4/2002 | Peterson et al. |
| 6,426,124 B2 | 7/2002 | Olster et al. |
| 6,426,461 B1 | 7/2002 | Ginter et al. |
| 6,447,126 B1 | 9/2002 | Hornbeck |
| 6,455,927 B1 | 9/2002 | Glenn et al. |
| 6,462,392 B1 | 10/2002 | Pinter et al. |
| 6,465,355 B1 | 10/2002 | Horsley |
| 6,466,354 B1 | 10/2002 | Gudeman |
| 6,472,739 B1 | 10/2002 | Wood et al. |
| 6,489,670 B1 | 12/2002 | Peterson et al. |
| 6,495,895 B1 | 12/2002 | Peterson et al. |
| 6,507,385 B1 | 1/2003 | Nishiyama et al. |
| 6,525,416 B2 | 2/2003 | Hauser et al. |
| 6,538,312 B1 | 3/2003 | Peterson et al. |
| 6,558,820 B2 | 5/2003 | Raychaudhuri et al. |
| 6,583,921 B2 | 6/2003 | Nelson |
| 6,589,625 B1 | 7/2003 | Kothari et al. |
| 6,603,182 B1 | 8/2003 | Low et al. |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles et al. |
| 6,680,792 B2 | 1/2004 | Miles |
| 6,690,444 B1 | 2/2004 | Wilkinson et al. |
| 6,778,046 B2 | 8/2004 | Stafford et al. |
| 6,779,260 B1 | 8/2004 | Brandenburg et al. |
| 6,833,668 B1 | 12/2004 | Yamada et al. |
| 6,843,936 B1 | 1/2005 | Jacobs |
| 6,867,896 B2 | 3/2005 | Miles |
| 6,882,458 B2 | 4/2005 | Lin et al. |
| 6,882,480 B2 | 4/2005 | Yanagisawa |
| 6,947,200 B2 | 9/2005 | Huibers |
| 6,995,890 B2 | 2/2006 | Lin |
| 6,999,225 B2 | 2/2006 | Lin et al. |
| 7,015,885 B2 | 3/2006 | Novotny et al. |
| 7,019,458 B2 | 3/2006 | Yoneda |
| 7,034,984 B2 | 4/2006 | Pan et al. |
| 7,042,643 B2 | 5/2006 | Miles |
| 7,060,895 B2 | 6/2006 | Kothari et al. |
| 7,123,216 B1 | 10/2006 | Miles |
| 7,126,741 B2 | 10/2006 | Wagner et al. |
| 7,161,728 B2 | 1/2007 | Sampsell et al. |
| 7,164,520 B2 | 1/2007 | Palmateer et al. |
| 2001/0004085 A1 | 6/2001 | Gueissaz |
| 2001/0055146 A1 | 12/2001 | Atobe et al. |
| 2002/0012364 A1 | 1/2002 | Kalian et al. |
| 2002/0043706 A1 | 4/2002 | Jerominek et al. |
| 2002/0052392 A1 | 5/2002 | Day et al. |
| 2002/0056898 A1 | 5/2002 | Lopes et al. |
| 2002/0056900 A1 | 5/2002 | Liu et al. |
| 2002/0057565 A1 | 5/2002 | Seo |
| 2002/0070931 A1 | 6/2002 | Ishikawa |
| 2002/0075551 A1 | 6/2002 | Daneman et al. |
| 2002/0075555 A1 | 6/2002 | Miles |
| 2002/0126364 A1 | 9/2002 | Miles |
| 2002/0132389 A1 | 9/2002 | Patel et al. |
| 2002/0160583 A1 | 10/2002 | Song |
| 2002/0187254 A1 | 12/2002 | Ghosh |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0108306 A1 | 6/2003 | Whitney et al. |
| 2003/0111603 A1 | 6/2003 | Sone et al. |
| 2003/0144034 A1 | 7/2003 | Hack et al. |
| 2003/0152872 A1 | 8/2003 | Miles |
| 2003/0161126 A1 | 8/2003 | Wilkinson et al. |
| 2003/0183916 A1 | 10/2003 | Heck et al. |
| 2003/0184412 A1 | 10/2003 | Gorrell |
| 2004/0051929 A1 * | 3/2004 | Sampsell et al. ............ 359/247 |
| 2004/0061492 A1 | 4/2004 | Lopes et al. |
| 2004/0066258 A1 | 4/2004 | Cohn et al. |
| 2004/0076008 A1 | 4/2004 | Ikeda |
| 2004/0100677 A1 | 5/2004 | Huibers et al. |
| 2004/0140557 A1 | 7/2004 | Sun et al. |
| 2004/0150319 A1 | 8/2004 | Tomimatsu et al. |
| 2004/0163472 A1 | 8/2004 | Nagahara |
| 2004/0173886 A1 | 9/2004 | Carley |
| 2004/0183990 A1 | 9/2004 | Guang et al. |
| 2004/0184133 A1 | 9/2004 | Su et al. |
| 2004/0218251 A1 | 11/2004 | Piehl et al. |
| 2005/0002079 A1 | 1/2005 | Novotny et al. |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0042117 A1 | 2/2005 | Lin |
| 2005/0046919 A1 | 3/2005 | Taguchi et al. |
| 2005/0074919 A1 | 4/2005 | Patel |
| 2005/0093134 A1 | 5/2005 | Tarn |
| 2005/0159028 A1 | 7/2005 | Sweetland et al. |
| 2005/0167795 A1 | 8/2005 | Higashi |
| 2005/0184304 A1 | 8/2005 | Gupta et al. |
| 2005/0195462 A1 | 9/2005 | Lin |
| 2005/0253283 A1 | 11/2005 | DCamp et al. |
| 2005/0254982 A1 | 11/2005 | Cadeddu |
| 2006/0029732 A1 | 2/2006 | Kobrin et al. |
| 2006/0066935 A1 | 3/2006 | Cummings et al. |
| 2006/0076648 A1 * | 4/2006 | Gally et al. ................. 257/619 |
| 2006/0148365 A1 | 7/2006 | Tsai |
| 2006/0274400 A1 | 12/2006 | Miles |
| 2007/0170568 A1 | 7/2007 | Chui et al. |

FOREIGN PATENT DOCUMENTS

| | | |
|---|---|---|
| EP | 0 695 959 | 2/1996 |
| EP | 0 822 570 | 2/1998 |
| EP | 1418154 A2 | 5/2004 |
| EP | 1 433 742 | 6/2004 |
| FR | 2841380 | 12/2003 |
| JP | 61-206244 | 9/1986 |
| JP | 63-162378 | 10/1988 |
| JP | 02-068513 | 3/1990 |
| JP | 03-199920 | 8/1991 |
| JP | 08-162006 | 6/1996 |
| JP | 10-70287 | 3/1998 |
| JP | 11 337953 | 12/1999 |
| JP | 2001-318324 | 11/2001 |
| JP | 2001-351998 | 12/2001 |

| | | |
|---|---|---|
| JP | 2002-062491 | 2/2002 |
| JP | 2002-062492 | 2/2002 |
| JP | 2002-258310 | 9/2002 |
| JP | 2002-296519 | 10/2002 |
| JP | 2002-312066 | 10/2002 |
| JP | 2002-328313 | 11/2002 |
| JP | 2002-357846 | 12/2002 |
| JP | 2003-075741 | 3/2003 |
| JP | 2003-233024 | 8/2003 |
| JP | 2003-330001 | 11/2003 |
| JP | 2004-053852 | 2/2004 |
| JP | 2004-78107 | 3/2004 |
| JP | 2004-118001 | 4/2004 |
| WO | WO 95/01624 | 1/1995 |
| WO | WO 95/30924 | 11/1995 |
| WO | WO 98/06118 | 2/1998 |
| WO | WO 99/41732 | 8/1999 |
| WO | WO 00/16105 | 3/2000 |
| WO | WO 00/17695 | 3/2000 |
| WO | WO 01/45140 | 6/2001 |
| WO | WO 01/58804 | 8/2001 |
| WO | WO 02/42716 | 5/2002 |
| WO | WO 03/023849 | 3/2003 |
| WO | WO 03/026369 A1 | 3/2003 |
| WO | WO 03/054925 | 3/2003 |
| WO | WO 03/070625 | 8/2003 |
| WO | WO 03/084861 | 10/2003 |
| WO | WO 03/095706 | 11/2003 |
| WO | WO 03/105198 | 12/2003 |
| WO | WO 2004/077523 | 9/2004 |
| WO | WO 2005/066596 | 7/2005 |
| WO | WO 2005/110914 | 11/2005 |
| WO | WO 2005/114294 | 11/2005 |

OTHER PUBLICATIONS

Stark et al., An Integrated process for post-packaging release and vacuum sealing of electroplated nickel packages, Transducers, 12th International Conference on Solid-State Sensors, Actuators and Microsystems, 2003, pp. 1911-1914.
Liang et al. "A Low Temperature Wafer-level hermetic MEMS package using UV curable adhesive" Electronic Components and Technology 2004, pp. 1486-1491.
Moraja, et al. Advanced Getter Solutions at Wafer Level to Assure High Reliability to the last Generations MEMS, IEEE, Reliability Physics Symposium Proceedings, 2003 pp. 458-459.
Sparks, et al. Chip-Level Vacuum Packaging of Micromachines Using NanoGetters, IEEE Transactions on Advanced Packaging, vol. 26 Issue 3, Aug. 2003, pp. 277-282.
EP Search Report for EP patent application No. 05255700.6-2217.
EP Search Report for EP patent application No. 05255684.2217.
Extendend European Search Report for App. No. 05255641.2, dated May 29, 2008.
Greco et al., Optical properties of IPN-like networks polyethylene/poly(butylmethacrylate-co-styrene copolymer systems, III. Influence of copolymer crosslinkers, Polymer 42 (2001), 5089-5095.
Tilmans et al., The indent reflow sealing (IRS) technique—A method for the fabrication of sealed cavities for mems devices, Journal of Microelectromechanical Systems, 9(2), Jun. 2000.
Office Action dated May 9, 2008 in Chinese App. No. 200510105841.X.
Notification of Reasons for Rejection in Japanese App. No. 2005-276442, dated Jul. 1, 2008.

* cited by examiner

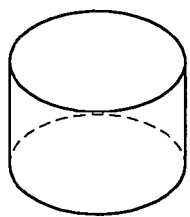
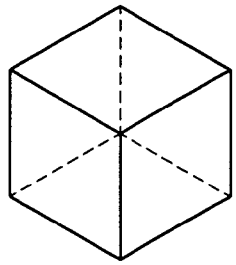
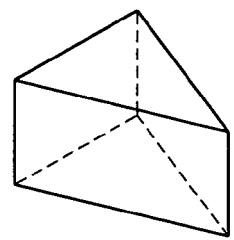
FIG. 12a            FIG. 12b            FIG. 12c
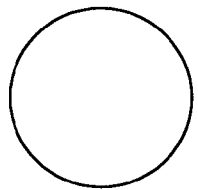
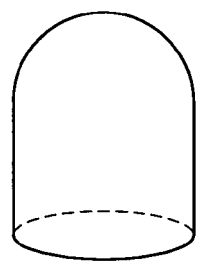
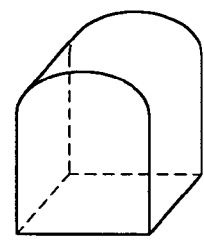
FIG. 12d            FIG. 12e            FIG. 12f
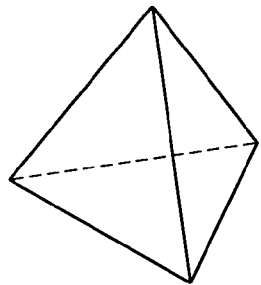
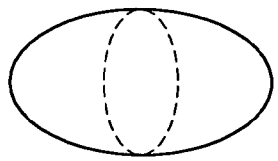
FIG. 12g                    FIG. 12h
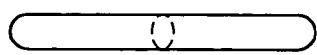
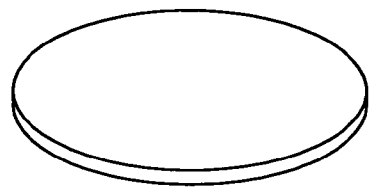
FIG. 12i                    FIG. 12j

US 7,573,547 B2

SYSTEM AND METHOD FOR PROTECTING MICRO-STRUCTURE OF DISPLAY ARRAY USING SPACERS IN GAP WITHIN DISPLAY DEVICE

CROSS-REFERENCE TO RELATED APPLICATIONS

This application claims the benefit of and incorporates by reference U.S. Application No. 60/613,682, filed Sep. 27, 2004, and U.S. Application No. 60/613,406, filed Sep. 27, 2004.

BACKGROUND

1. Field of the Invention

The invention relates to electronic devices. More particularly, the invention relates to a packaging system and a method for protecting a microelectromechanical device from physical damage.

2. Description of the Related Technology

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

Physical forces sufficient to deform an electronic device and/or packaging for the electronic device can damage the device. Some mechanical components in a device, for example, in a microelectromechanical device and/or in an interferometric modulator are particularly susceptible to damage. Accordingly, provided herein is a packaging system and packaged electronic device that resists physical damage, a method for manufacturing the same, and a method for protecting an electronic device from physical damage. The packaging system for the electronic device includes one or more spacers that prevent or reduce damage to the electronic device arising from contact with the packaging. In some embodiments, the packaged electronic device comprising spacers is thinner than a comparable device manufactured without spacers.

Accordingly, some embodiments of the packaged electronic device provided herein comprise: an electronic device formed on a substrate; a backplate; a seal disposed between the substrate and the backplate, wherein the substrate, backplate, and seal together package the electronic device; and at least one spacer disposed between the electronic device and the backplate, wherein at least one of the spacers prevents the backplate from contacting the electronic device.

Other embodiments provide a method for manufacturing a packaged electronic device and a packaged electronic device manufactured by the method, wherein the method comprises: providing an electronic device on a substrate; disposing one or more spacers in the proximity of the electronic device; and sealing a backplate onto the substrate to form a display package, wherein at least one of the spacers prevents the backplate from contacting the electronic device.

Other embodiments provide a packaged electronic device comprising: an array of interferometric modulators formed on a substrate; a backplate; a seal disposed between the substrate and the backplate, wherein the substrate, backplate, and seal together package the array of interferometric modulators; and a means for preventing the array and the backplate from contacting each other disposed within the display package.

In some embodiments, the electronic device is a microelectomechanical system (MEMS) device. In some embodiments, the MEMS device is an interferometric modulator. In some embodiments, a plurality of interferometric modulators are formed in an array. A packaged electronic device comprising an array of interferometric modulators is also referred to herein as a "display package." In some embodiments, the display package comprises a plurality of arrays of interferometric modulators.

In some embodiments, the substrate is at least partially transparent and/or translucent. In some embodiments, the interferometric modulators are configured to reflect light through the transparent and/or translucent portion of the substrate.

In some embodiments, the backplate comprises a recessed cap. In some embodiments, the backplate comprises glass. In some embodiments, the backplate comprises a desiccant.

In some embodiments, the seal is a semi-hermetic seal and/or a hermetic seal. In some embodiments, the seal comprises a desiccant.

In some embodiments, a spacer comprises a desiccant. In some embodiments, the spacers are regularly spaced. In other embodiments, the spacers are irregularly spaced.

BRIEF DESCRIPTION OF THE DRAWINGS

These and other aspects of the invention will be readily apparent from the following description and from the appended drawings (not to scale), which are meant to illustrate and not to limit the invention.

DETAILED DESCRIPTION OF CERTAIN EMBODIMENTS

Figure 1:
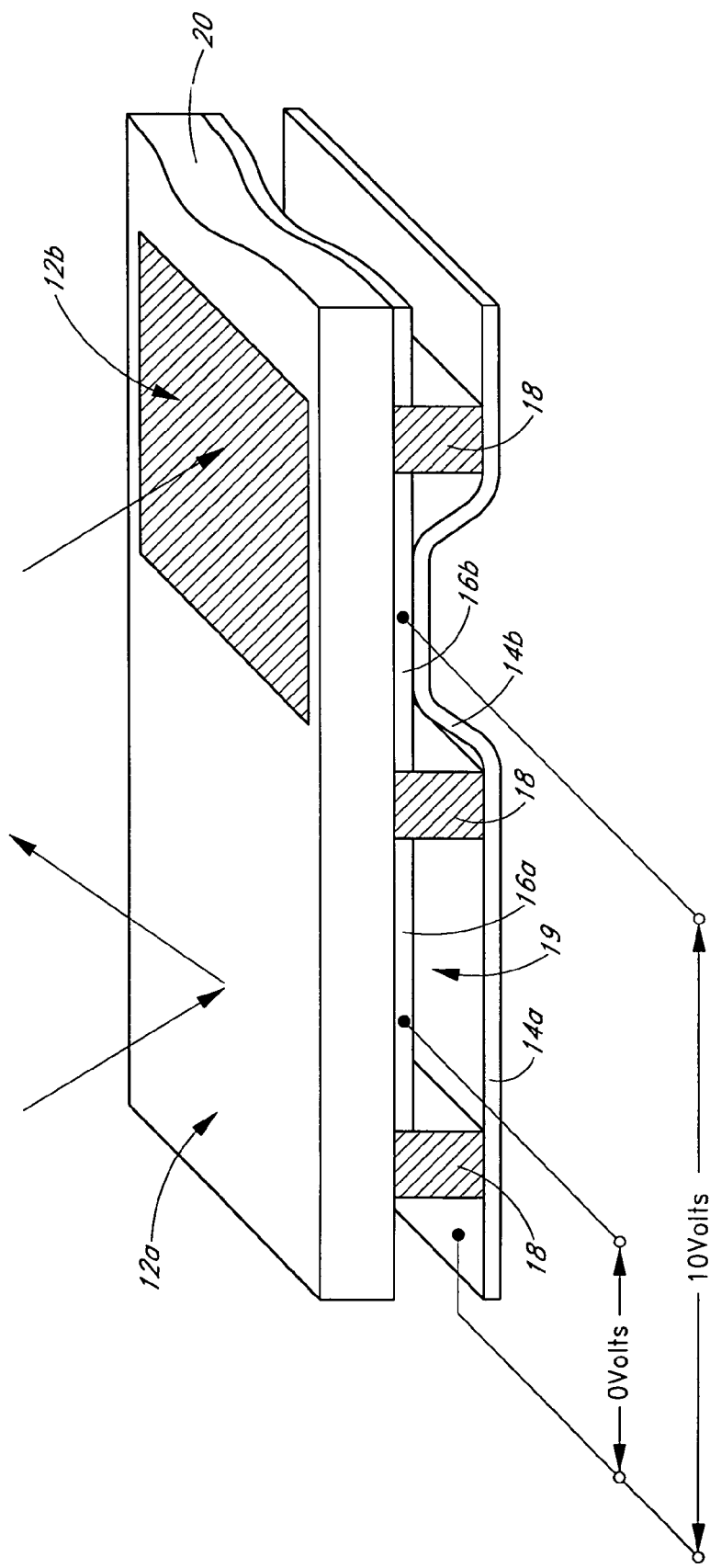
FIG. 1 is an isometric view depicting a portion of one embodiment of an interferometric modulator display in which a movable reflective layer of a first interferometric modulator is in a released position and a movable reflective layer of a second interferometric modulator is in an actuated position.

Electronic devices are susceptible to damage from physical assaults, for example, drops, twisting, impacts, pressure, and the like. Some devices are more sensitive to damage than others. For example, devices with moving parts are susceptible to displacement or breakage of one or more of the moving parts. Some microelectromechanical system (MEMS) devices are particularly sensitive to physical assaults because of the fine dimensions of their components. Consequently, such devices are typically packaged to reduce or prevent undesired contacts, which can damage to the device.

In some cases, the packaging itself is distorted or deformed by external forces, which cause components of the packaging to contact, and in some cases, damage or impair the operation of the device packaged therein. Accordingly, disclosed herein is a packing system for electronic devices, including MEMS devices, that includes spacers configured to prevent or reduce contacts of components in the packaged device likely to damage the electronic device. In some embodiments, the spacers are configured to prevent or reduce damage arising from contacts between the array of interferometric modulators and the backplate of a packaging system for the same. Consequently, in some embodiments, a package display comprising one or more spacers is thinner than an equivalent package display fabricated without spacers because the spacers permit disposing the backplate closer to the interferometric modulator array, as discussed below.

The interferometric modulator MEMS devices disclosed herein are useful in the fabrication of display devices. In some embodiments, the display comprises an array of interferometric modulators formed on a substrate, thereby producing a device that is relatively thin compared to its length and/or width. Some embodiments of such structures are susceptible to deflection or deformation by a force with a component that is normal to the surface of the device. Some embodiments of such structures are susceptible to deformation on torsion.

Those skilled in the art will understand that, all other things being equal, the deflection or deformation will increase with increasing length and/or width of the device.

Forces likely to induce such deflections and/or deformations are not unusual in portable electronic devices. Such forces arise in touch screen applications, for example, or in stylus-based interfaces. Furthermore, it is common for users to touch or press on the surface of a display, for example, when pointing out an image on a computer display. Inadvertent contact of the display also occurs, for example, on a mobile telephone display in a user's pocket or purse.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
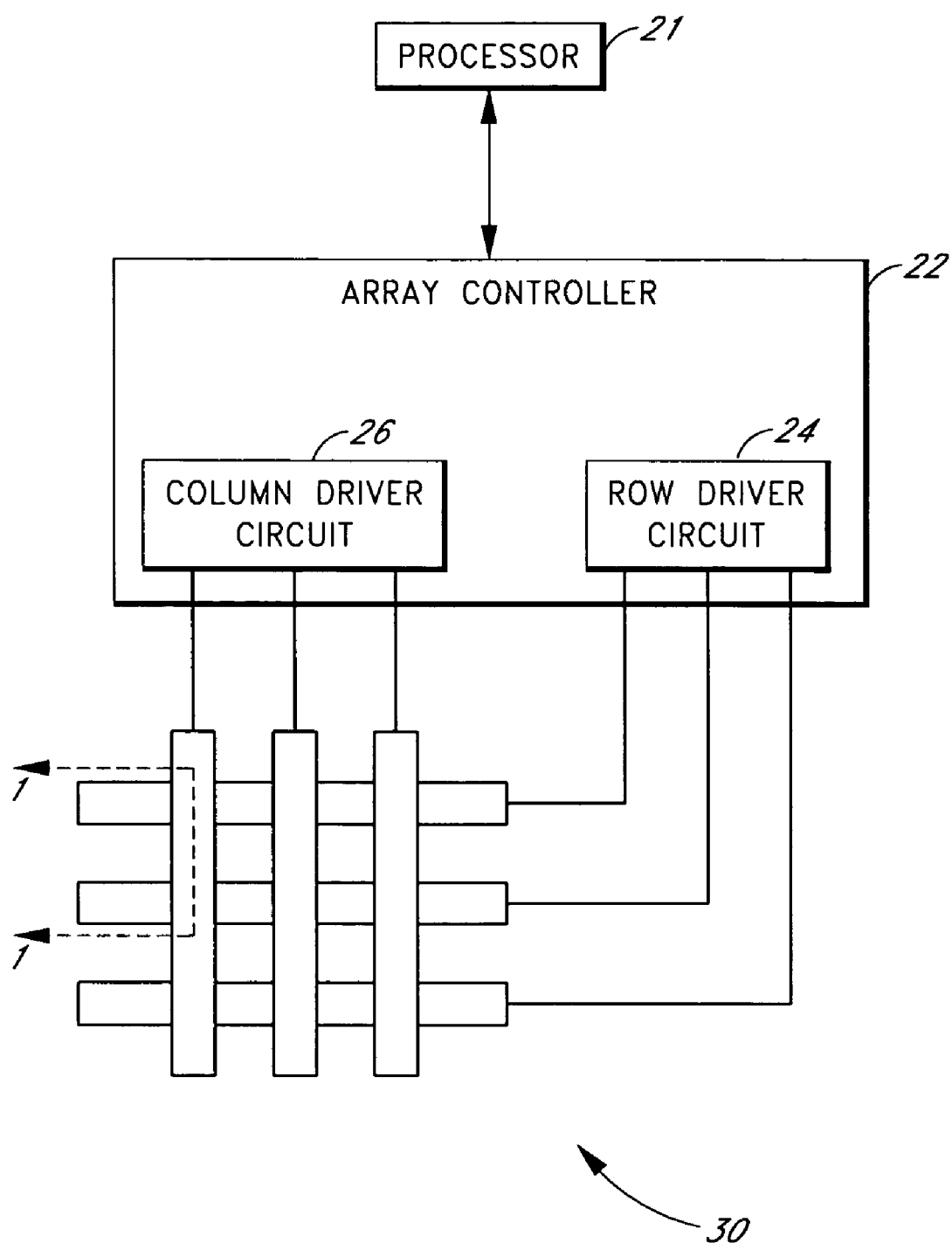
FIG. 2 is a system block diagram illustrating one embodiment of an electronic device incorporating a 3×3 interferometric modulator display.

FIG. 2 through FIG. 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
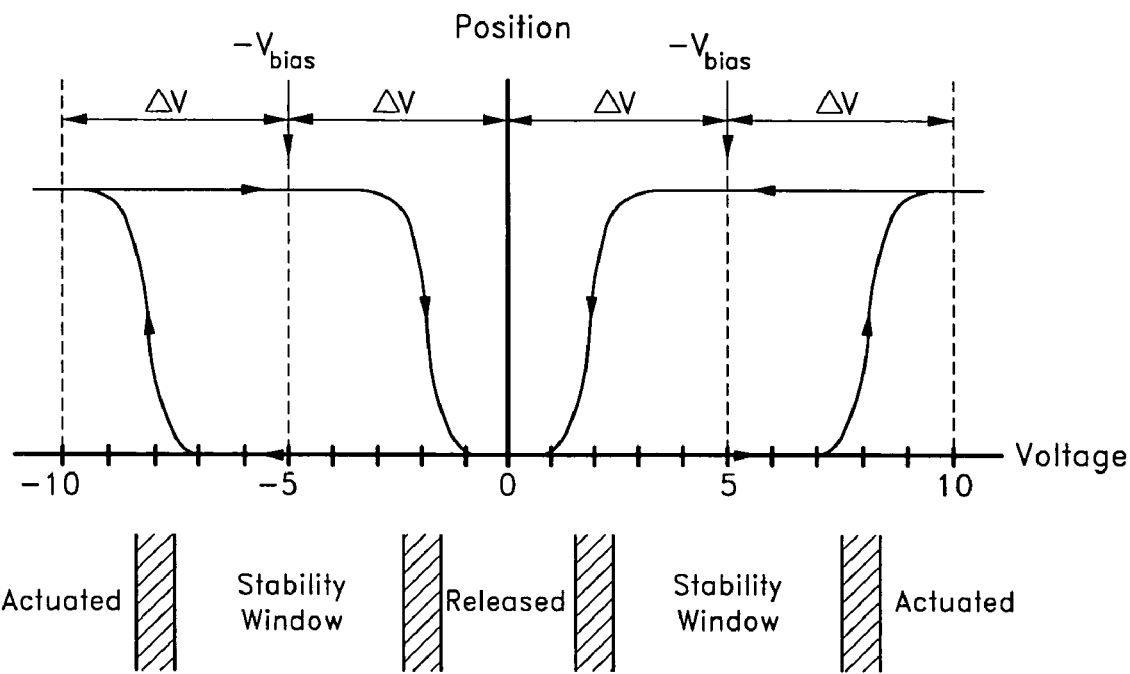
FIG. 3 is a diagram of movable mirror position versus applied voltage for one exemplary embodiment of an interferometric modulator of FIG. 1.
FIG. 4 is an illustration of sets of row and column voltages that may be used to drive an interferometric modulator display.

FIG. 4 and FIG. 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
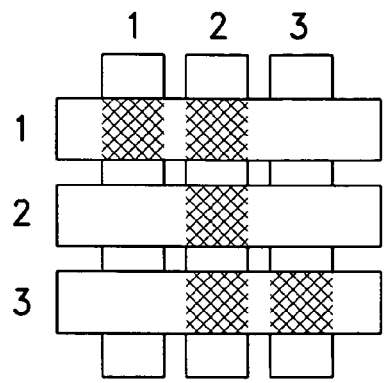
FIG. 5A and FIG. 5B illustrate one exemplary timing diagram for row and column signals that may be used to write a frame of display data to the 3×3 interferometric modulator display of FIG. 2.
Figure 5B:
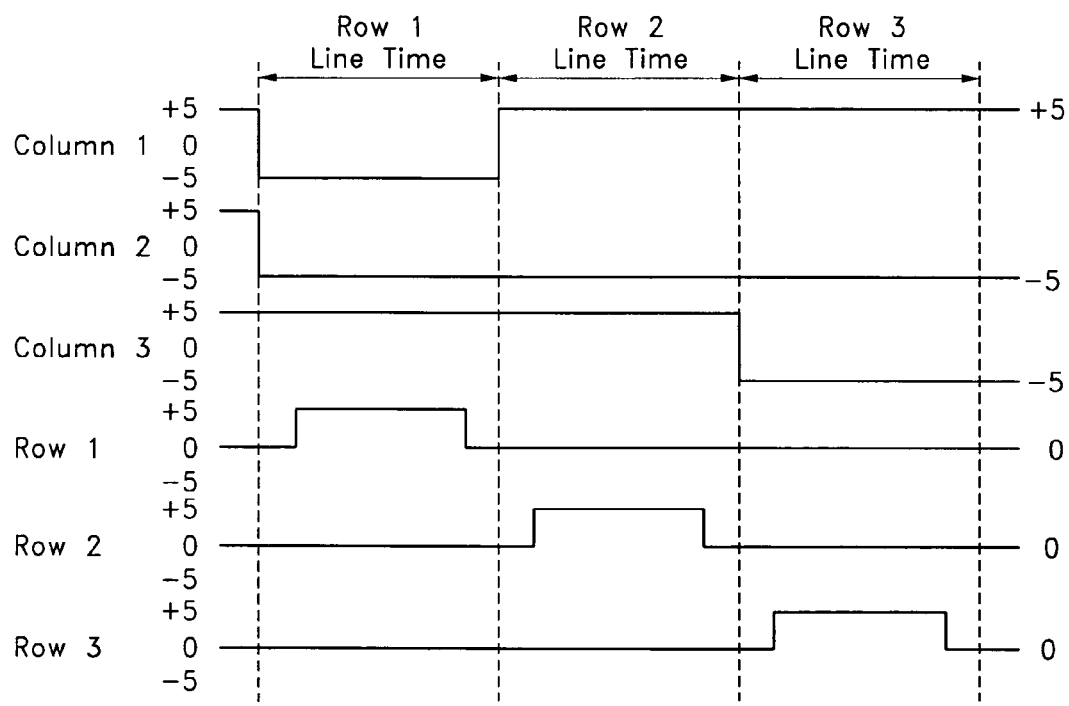

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
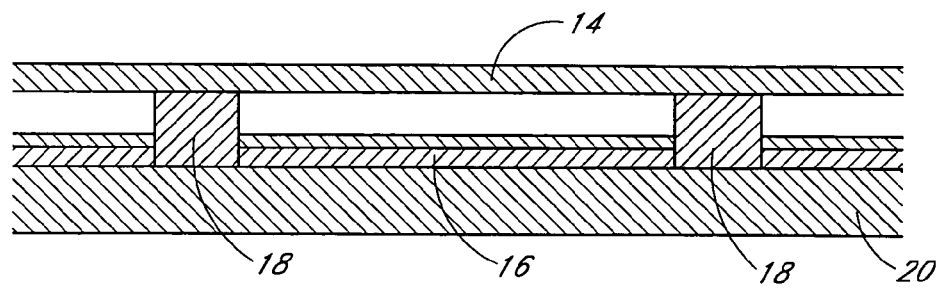
FIG. 6A is a cross section of the device of FIG. 1.
Figure 6B:
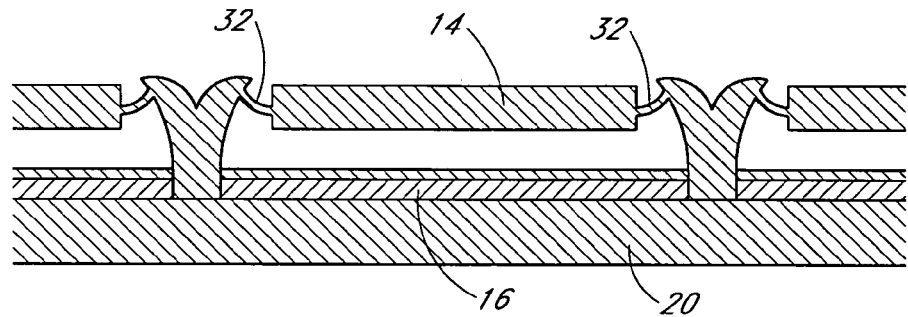
FIG. 6B is a cross section of an alternative embodiment of an interferometric modulator.
Figure 6C:
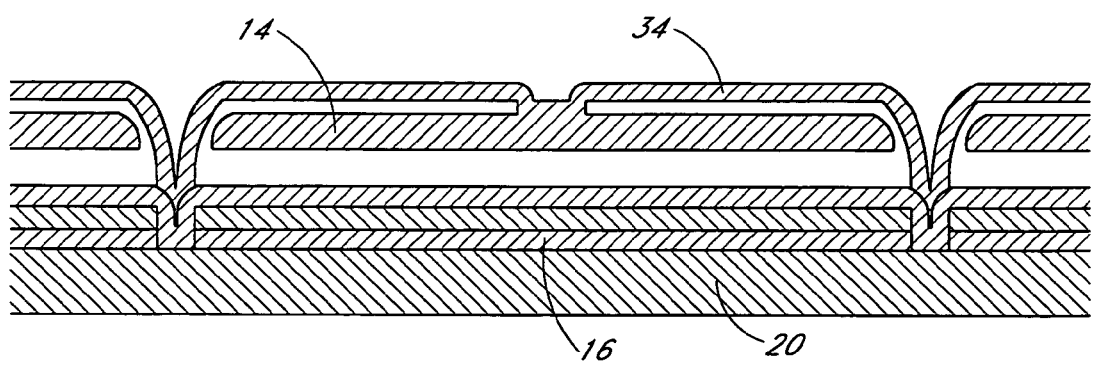
FIG. 6C is a cross section of an alternative embodiment of an interferometric modulator.

The details of the structure of interferometric modulators that operate in accordance with the principles set forth above may vary widely. For example, FIG. 6A-FIG. 6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

Figure 7A:
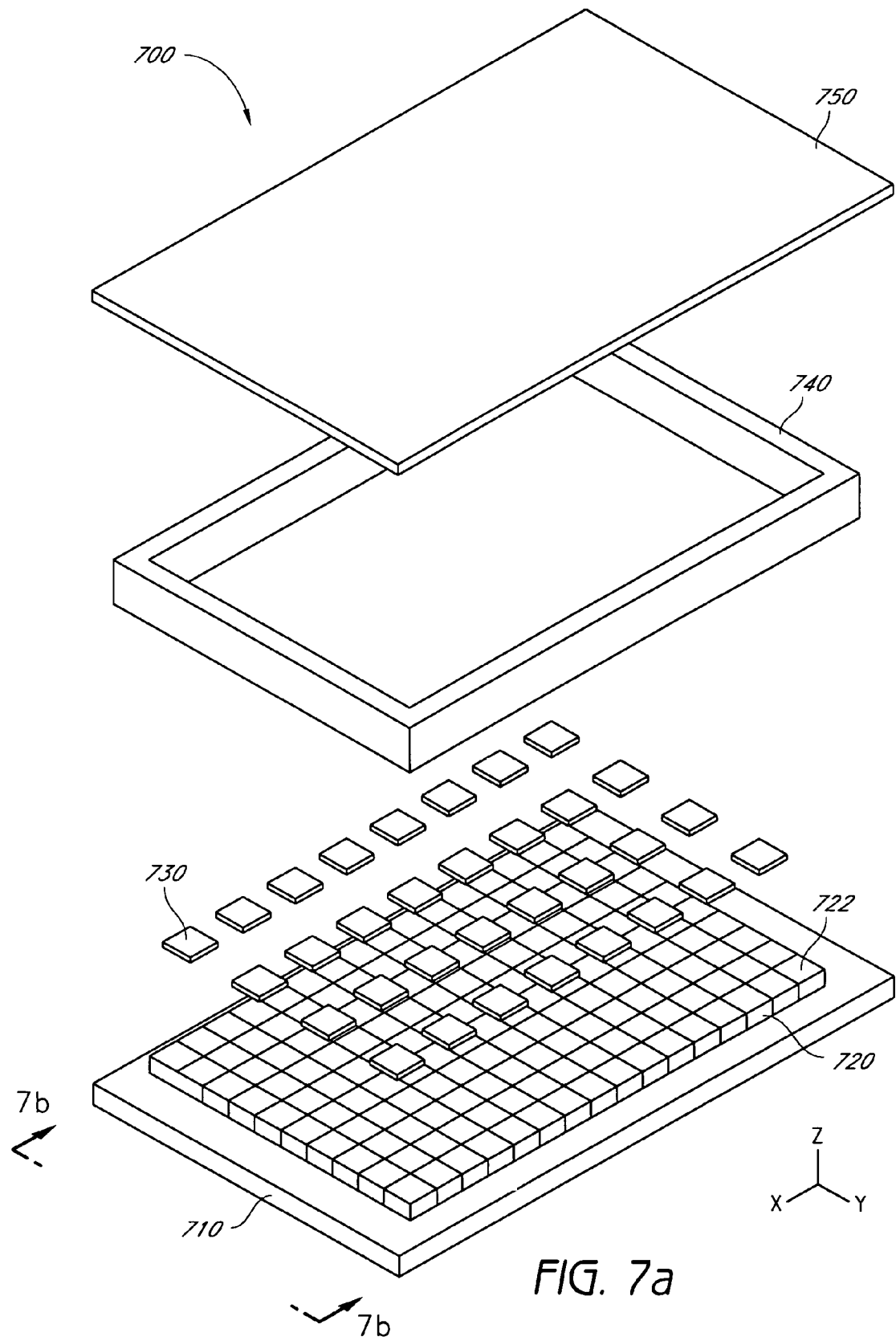
FIG. 7A and FIG. 7B illustrate an exploded view and a cross section of an embodiment of a display package comprising a spacer.
Figure 7B:
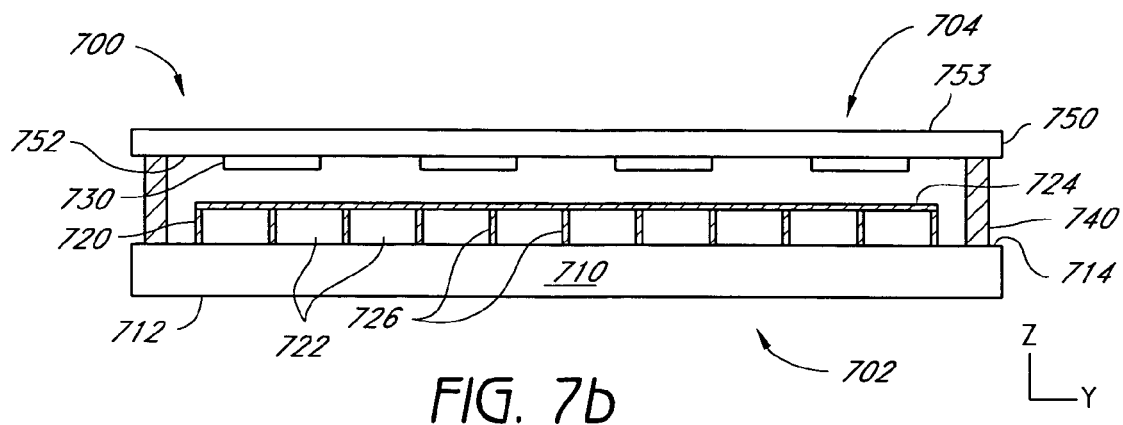

FIG. 7A and FIG. 7B illustrate an exploded view and cross-section of an embodiment of a packaged electronic device 700 comprising a substrate 710, an array 720 of interferometric modulators 722, one or more spacers 730, a seal 740, and a backplate 750. As best seen in FIG. 7B, the device 700 comprises a first side 702 and a second side 704. The substrate 710 comprises a first surface 712 and a second surface 714. On the second surface 714 of the substrate is formed the interferometric modulator array 720. In the illustrated embodiment, the backplate 750 is secured to the substrate 710 by the seal 740. Disposed between the array 720 and the backplate 750 is one or more spacers 730. Also illustrated in FIG. 7A are x, y, and z axes, and in FIG. 7B, y and z axes referred to in the description herein.

The substrate 710 and interferometric modulators 722 are described in greater detail above. Briefly, the substrate 710 is any substrate on which an interferometric modulator 722 is formable. In some embodiments, the device 700 displays an image viewable from the first side 702, and accordingly, the substrate 710 is substantially transparent and/or translucent. For example, in some embodiments, the substrate is glass, silica, and/or alumina. In other embodiments, the substrate 710 is not substantially transparent and/or translucent, for example, in a device 700 that displays an image viewable from the second side 704, or in a device 700 that does not display a viewable image. In some embodiments, the first surface 712 of the substrate further comprises one or more additional structures, for example, one or more structural, protective, and/or optical films.

The interferometric modulators 722 are of any type. In some embodiments, the interferometric modulator 722 comprises a mechanical layer 724 distal from the substrate 710 and proximal to the backplate 750. As discussed in greater detail below, in some embodiments, the mechanical layer 724 is susceptible to physical damage.

In the illustrated embodiments, the seal 740 secures the backplate 750 to the substrate 710. The term "perimeter support" is also used herein to refer to the seal 740. In the embodiment illustrated in FIG. 7B, the seal 740 also acts to maintain a predetermined spacing between the backplate 750 and substrate 710. In the embodiment illustrated in FIG. 7C, the seal 740' does not have a spacing function. In some embodiments, the seal does not produce or outgas a volatile compound, for example, hydrocarbons, acids, amines, and the like. In some embodiments, the seal is partially or substantially impermeable to liquid water and/or water vapor. In some embodiments, the seal is partially or substantially impermeable to air and/or other gases. In some embodiments, the seal is rigid. In other embodiments, the seal is elastic or elastomeric. In other embodiments, the seal comprises both rigid, and elastic or elastomeric components. In some embodiments, the seal comprises one or more adhesives compatible with the substrate and/or backplate. The adhesive or adhesives are of suitable any type known in the art. In some embodiments, one or more of the adhesives is pressure sensitive. In some embodiments, one or more of the adhesives is thermally cured. In some embodiments, one or more of the adhesives is UV-cured. In some embodiments, the seal is thermally bonded to the substrate and/or backplate. In some embodiments, the seal is secured to the substrate and/or backplate mechanically. Some embodiments use a combination of methods for securing the seal to the substrate and/or backplate. Some embodiments do not comprise a seal, for example, where the substrate is secured directly to the backplate, for example, by thermal welding.

The seal comprises any suitable material, for example, metals, steel, stainless steel, brass, titanium, magnesium, aluminum, copper, tin, lead, zinc, solder, polymer resins, epoxies, polyamides, polyalkenes, polyesters, polysulfones, polystyrene, polyurethanes, polyacrylates, cyanoacrylates, acrylic epoxies, silicones, rubbers, polyisobutylene, neoprene, polyisoprene, styrene-butadiene, parylene, U.V.-curable adhesives, ceramics, glass, silica, alumina, and blends, copolymers, alloys, and/or composites thereof. In some embodiments, the seal further comprises a reinforcement, for example, fibers, a mesh, and/or a fabric, for example, glass, metal, carbon, boron, carbon nanotubes, and the like. In some embodiments, the selected seal material is partially or substantially water impermeable. Accordingly, in some embodiments, the seal is a semi-hermetic or hermetic seal. In some embodiments, the seal is less than about 50 µm thick, for example, from about 10 µm to about 30 µm thick. In some embodiments, the seal is from about 0.5 mm to about 5 mm wide, for example, from about 1 mm to about 2 mm.

Returning to FIG. 7A and FIG. 7B, an embodiment of a method for fabricating the illustrated seal 740 using a UV-curable epoxy is described below. The epoxy is applied to the backplate 750 and/or substrate 710 using means known in the art, for example, by printing. The type and amount of epoxy is preselected to provide a seal 740 with the desired width, thickness, and moisture permeation properties. The backplate 750 and substrate 710 are brought together, and the epoxy cured by irradiation with a suitable source of UV radiation. A typical epoxy is cured using about 6000 mJ/cm$^2$ of UV radiation. Some embodiments also include a post-cure bake at about 80° C.

The backplate 750 is also referred to herein as a "cap" or "backplane." These terms are not intended to limit the position of the backplate 750 within the device 700, or the orientation of the device 700 itself. In some embodiments, the backplate 750 protects the array 720 from damage. As discussed above, some embodiments of an interferometric modulator 722 are potentially damaged by physical assaults. Consequently, in some embodiments, the backplate 750 protects the array 720 from contact with foreign objects and/or other components in an apparatus comprising the array 720, for example. Furthermore, in some embodiments, the backplate 750 protects the array 720 from other environmental conditions, for example, humidity, moisture, dust, changes in ambient pressure, and the like.

In embodiments in which the device 700 displays an image viewable from the second side 704, the backplate 750 is substantially transparent and/or translucent. In other embodiments, the backplate 750 is not substantially transparent and/or translucent. In some embodiments, the backplate 750 is made from a material that does not produce or outgas a volatile compound, for example, hydrocarbons, acids, amines, and the like. In some embodiments, the backplate 750 is substantially impermeable to liquid water and/or water vapor. In some embodiments, the backplate 750 is substantially impermeable to air and/or other gases. Suitable materials for the backplate 750 include, for example, metals, steel, stainless steel, brass, titanium, magnesium, aluminum, polymer resins, epoxies, polyamides, polyalkenes, polyesters, polysulfones, polystyrene, polyurethanes, polyacrylates, parylene, ceramics, glass, silica, alumina, and blends, copolymers, alloys, composites, and/or combinations thereof. Examples of suitable composite materials include composite films available from Vitex Systems (San Jose, Calif.). In some embodiments, the backplate 750 further comprises a reinforcement, for example, fibers and/or a fabric, for example, glass, metal, carbon, boron, carbon nanotubes, and the like.

In some embodiments, the backplate 750 is substantially rigid. In other embodiments, the backplate 750 is flexible, for example, foil or film. In some embodiments, the backplate 750 is deformed in a predetermined configuration before and/or during assembly of the package structure 700. As will be discussed in greater detail below, in some embodiments, the backplate 750 is an element in a system for preventing damage to the array 710.

The backplate 750 comprises an inner surface 752 and an outer surface 753. In some embodiments, the inner surface and/or outer surface of the backplate further comprise one or more additional structures, for example, a structural, protective, mechanical, and/or optical film or films.

Figure 7C:
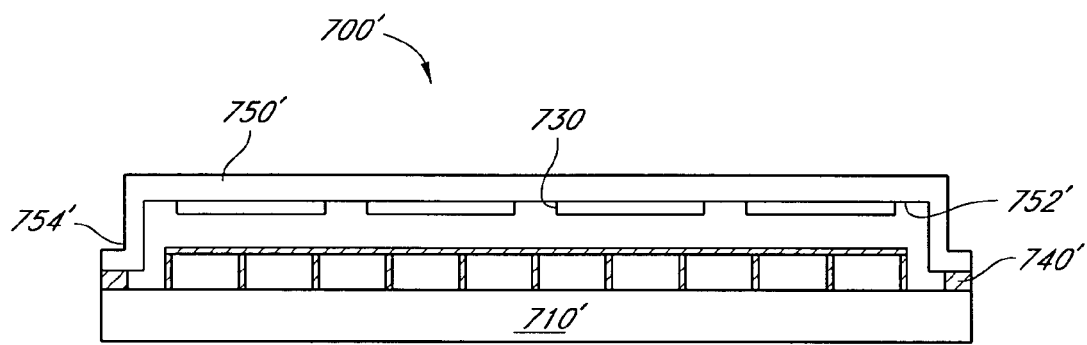
FIG. 7C illustrates an embodiment of a display package comprising a recessed cap.

In the embodiment illustrated in FIG. 7B, the backplate 750 is substantially planar. FIG. 7C illustrates an embodiment of a device 700' in which the inner surface 752' of the backplate is recessed, thereby forming a flange 754' at the perimeter of the backplate 750'. A backplate with this configuration is referred to as a "recessed cap" herein.

Figure 7D:
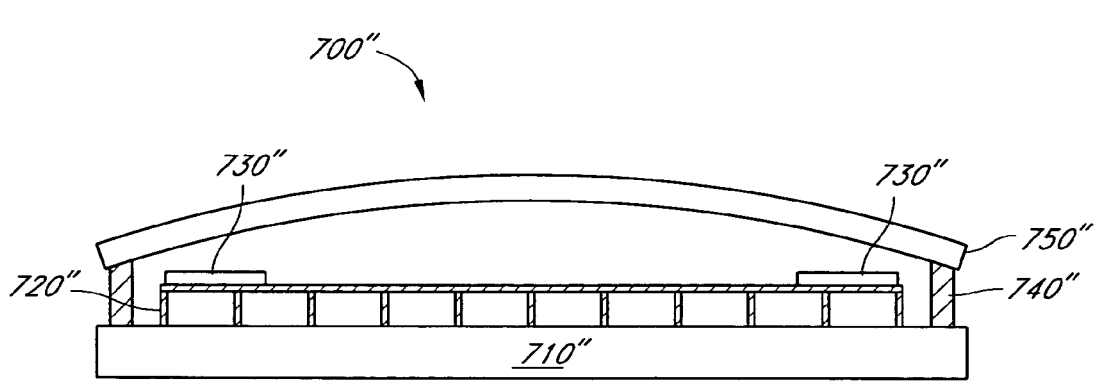
FIG. 7D illustrates an embodiment of a display package that comprises a curved backplate.

FIG. 7D illustrates in cross section an embodiment of a package device 700" comprising a curved or bowed backplate 750". In the illustrated embodiment, spacers 730" are disposed near the periphery of an array 720", which is relatively closer to the backplate 750", and consequently, more likely to contact the backplate 75" and sustain damage. Other embodiments comprise a different configuration of one or more spacers. Spacers are discussed in greater detail below. In some embodiments, the backplate 750" is preformed into the curved configuration. In other embodiments, the curved shape of the backplate 750" is formed by bending or deforming a substantially flat precursor during assembly of the package device 700". For example, in some embodiments, an array 720" of interferometric modulators is formed on a substrate 710" as described above. A seal material, for example, a UV curable epoxy, is applied to the periphery of a substantially planar backplate 750", which is wider and/or longer than the substrate 710". The backplate 750" is deformed, for example, by compression, to the desired size, and positioned on the substrate 710". The epoxy is cured, for example, using UV radiation to form the seal 740".

Figure 8A:
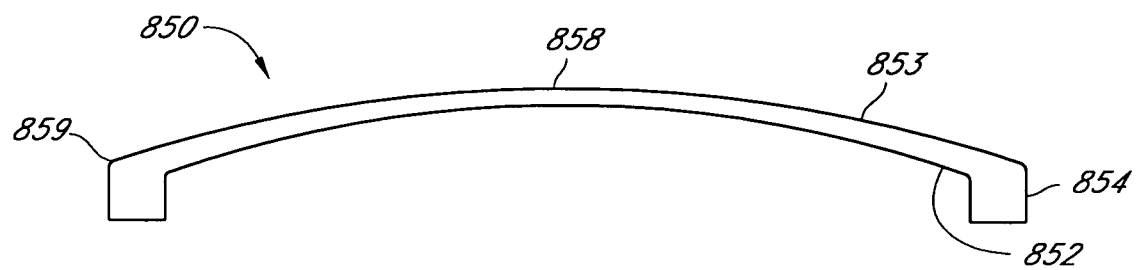
FIG. 8A illustrates a cross section of an embodiment of a recessed cap.
Figure 8B:
FIG. 8B illustrates a cross section of an embodiment of a backplate comprising reinforcing ribs.
Figure 8C:
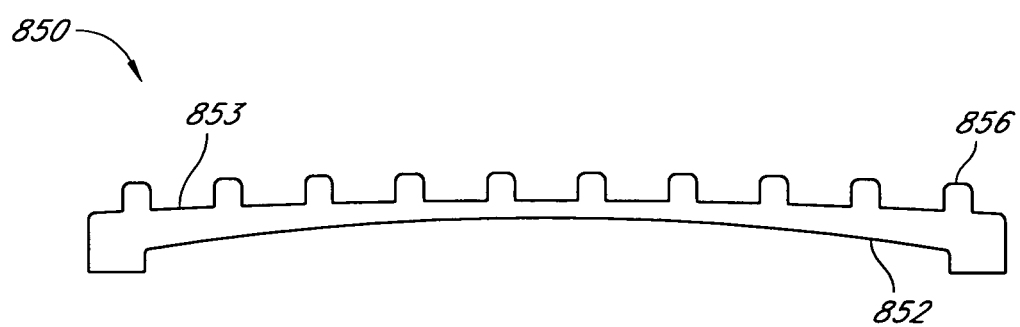
FIG. 8C illustrates a cross section of an embodiment of a recessed cap comprising reinforcing ribs.

Other embodiments for the backplate are illustrated FIG. 8A-FIG. 8C. FIG. 8A illustrates a recessed cap 850 in which the inner surface 852 is concave. In the illustrated embodiment, the inner surface 852 and the outer surface 853 are not parallel. Consequently, the recessed cap 850 is thinner at the center 858 than at the edge 859. Those skilled in the art will understand that other arrangements are possible. The illustrated embodiment comprises a peripheral flange 854, which sets the minimum spacing between the substrate and the inner surface 852 of the recessed cap backplate. In some embodiments, the peripheral flange 854 forms a substantially continuous structure around the periphery of the recessed cap 850. In other embodiments, the peripheral flange 854 is not continuous. Other embodiments do not comprise a peripheral flange. In FIG. 8B, the backplate 850 comprises reinforcing ribs 856 on the outer surface 853. In other embodiments, the reinforcing ribs are on the inner surface 852 or on both surfaces of the backplate. In some embodiments, the reinforcing structure has another shape, for example, a grid, or honeycomb. Some embodiments comprise a combination of these features. For example, FIG. 8C illustrates an embodiment of a recessed cap 850 with a concave inner surface 852 and reinforcing ribs 856 on the outer surface 853. Some embodiments of the disclosed backplates exhibit improved properties, for example, strength, weight, cost, rigidity, transparency, ease of manufacturing, and the like.

Figure 8D:
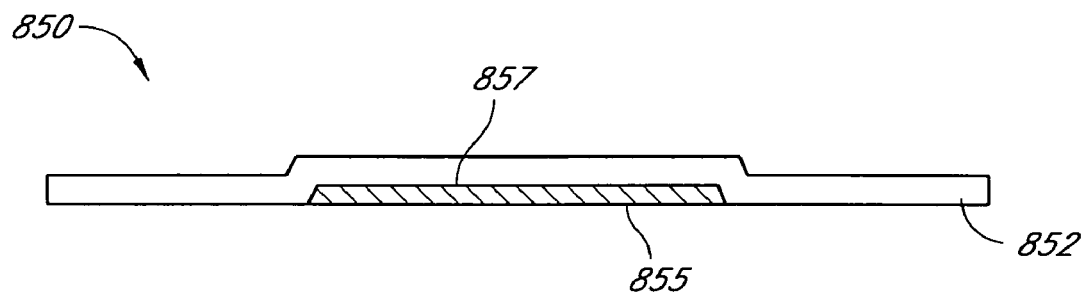
FIG. 8D and FIG. 8E illustrate in cross section backplates comprising cavities in which a desiccant is disposed.
Figure 8E:
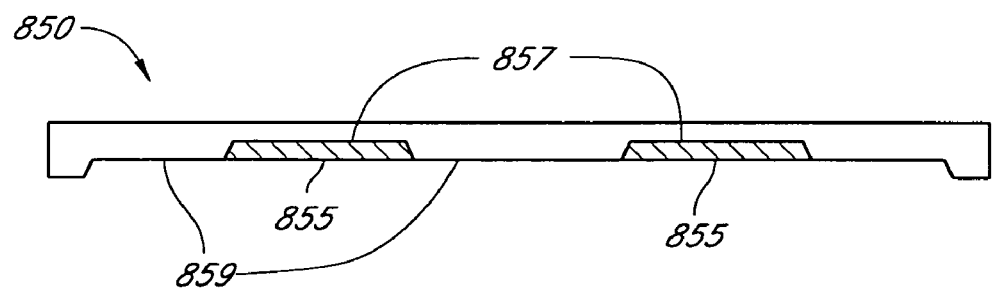

FIG. 8D and FIG. 8E illustrate in cross section backplates comprising one or more cavities configured to contain a desiccant. FIG. 8D illustrates an embodiment of a backplate 850 comprising a cavity 857 formed on the inner surface 852 of the backplate i.e. between the backplate and the array. A desiccant 855 is disposed in the cavity 857. FIG. 8E illustrates an embodiment of a recessed cap backplate 850 comprising two cavities 857 in which desiccant 855 is disposed. In the embodiments illustrated in FIG. 8D and FIG. 8E, the desiccant 855 substantially does not extend past the inner surface 852 of the backplate. Accordingly, the same spacers discussed below are usable anywhere between the array and backplate. The dimensions of the cavities 857 are selected according to factors known in the art, for example, the properties of the desiccant, the quantity of desiccant to be used, the amount of moisture to be absorbed, the volume of the device, the mechanical properties of the backplate, and the like. Suitable desiccants and methods for securing a desiccant to a backplate are discussed below. Those skilled in the art will appreciate that in other embodiments, the cavities 857 have a different configuration, for example, length, width, thickness, and/or shape. The cavities 857 are fabricated by any method known in the art, for example, etching, embossing, stamping, engraving, machining, grinding, milling, sandblasting, molding, slumping, and the like. In some embodiments, recesses are created by building up the non-recessed portions of the backplate 859, for example, using an adhesive, welding, fusing, sintering, and the like. For example, in some embodiments, a slurry of glass is sprayed onto or molded on the backplate and the slurry fused or sintered to form a cavity. Those skilled in the art will understand that combinations of these methods are also suitable for fabricating backplates with any of the features described herein, for example, the backplates illustrated in FIG. 7A-FIG. 7D and FIG. 8A-FIG. 8E.

Referring again to FIG. 7B, the seal 740 extends between the substrate 710 and backplate 750. In some embodiments, the substrate 710, backplate 750, and seal 740 together substantially completely enclose the array 720. In some embodiments, the enclosure 706 formed therefrom is substantially impermeable to liquid water, water vapor, and/or particles, for example, dirt or dust. In some embodiments, the enclosure 706 is substantially hermetically and/or semi-hermetically sealed.

In some embodiments, the inner surface 752 of the backplate contacts the array 720. In some embodiments, the inner surface 752 does not contact the array 720. In some embodiments, the gap or headspace between the inner surface 752 of the backplate and the array 720 is at least about 10 μm. In some preferred embodiments, the gap is from about 30 μm to about 100 μm, for example, about 40 μm, 50 μm, 60 μm, 70 μm, 80 μm, or 90 μm. In some embodiments the gap is at greater than 100 μm, for example 0.5 mm, 1 mm, or greater. In some embodiments, the gap or headspace between the inner surface 752 of the backplate and the array 720 is not constant.

Figure 9:
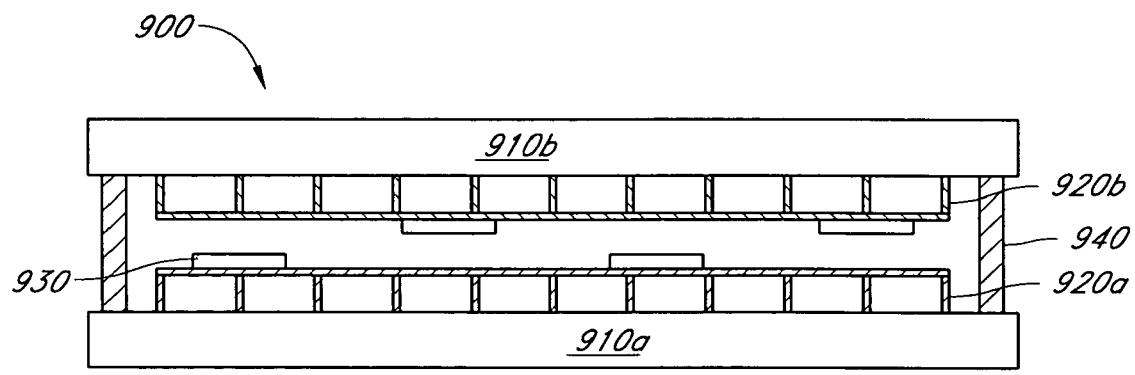
FIG. 9 illustrates a cross section of a double array device, which comprises two interferometric modulator arrays.

FIG. 9 illustrates an embodiment of the package device 900 comprising a first substrate 910a, on which a first array 920a of interferometric modulators 922a is formed, and a second substrate 910b, on which a second array 920b of interferometric modulators 922b is formed. A device with this configuration is also referred to herein as a "double array device." Such a device may be viewed as one in which the backplate is replaced with a second interferometric modulator array. Accordingly, the package device 900 is capable of simultaneously displaying a first image on the first array 920a and a second image on the second array 920b. The package device 900 also comprises a seal 940 as described above. Disposed between the first array 920a and second array 920b is one or more spacers 930 of any suitable type disclosed herein.

Figure 10:
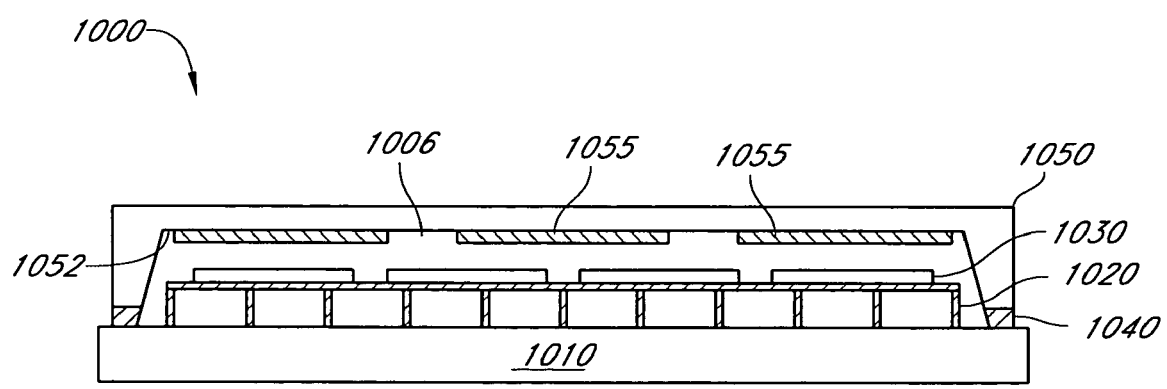
FIG. 10 illustrates a cross section of an embodiment of a display package comprising a desiccant.

An embodiment 1000 illustrated in FIG. 10 comprises an array 1020 of interferometric modulators formed on a substrate 1010. A recessed cap backplate 1050 and seal 1040 together with the substrate 1010 form a cavity or enclosed space 1006 in which is disposed one or more spacers 1030. In the illustrated embodiment, the backplate 1050 comprises one or more units of a desiccant 1055. The desiccant maintains a reduced humidity within the enclosed space 1006. In some embodiments, a package of desiccant 1055 is secured to the inner surface 1052 of the backplate, for example, using an adhesive, thermally, and/or mechanically. Suitable packaging into which a desiccant is suitably held are known in the art, including, for example, a container with a mesh surface, a perforated container, a bag made from a permeable fabric or cover stock, and the like. In other embodiments, the packaging is a sheet of a suitable material secured to the backplate, for example, using a pressure-sensitive adhesive. In some embodiments, the package is non-dusting, i.e., resists releasing dust. In some embodiments, the desiccant is embedded in an inert carrier, for example, a polymer resin, and the assembly secured to the inner surface 1052. In some embodiments, the desiccant 1055 is directly secured to the inner surface 1052 of the backplate. In some embodiments, the material from with the backplate 1050 is fabricated comprises a desiccant. In some embodiments, the backplate comprises a layer of applied desiccant. For example, in some embodiments, a liquid desiccant or a desiccant dissolved or suspended in a suitable liquid is applied to the backplate 1050 and baked, thereby forming a layer of desiccant on the backplate 1050. In other embodiments, a desiccant is mixed with an uncured polymer resin and the mixture applied to the backplate 1050 and cured.

The desiccant is any suitable desiccant known in the art, for example, metal oxides, calcium oxide, barium oxide, boric anhydride, phosphorus pentoxide, metal sulfates, calcium sulfate, magnesium sulfate, sodium sulfate, metals, sodium, lead/sodium alloy, metal hydrides, sodium borohydride, sodium hydride, lithium aluminum hydride, silica gel, activated alumina, zeolites, molecular sieves, phosphorus, metal salts, magnesium perchlorate, zinc chloride, carbon nanotubes, and combinations thereof.

Returning to FIG. 7A and FIG. 7B, and as discussed above, in some embodiments, the device 700 deforms on application of an external force. Those skilled in the art will recognize that, in some embodiments, the deformation will result in relative or differential movement between the array 720 and the backplate 750. In some embodiments, forces likely to be encountered in the normal use of the device 700, for example, in the construction of the device 700, in the installation of the device 700 in an apparatus, or in the normal use of the device 700, are insufficient to cause the array 720 to contact the backplate 750. As discussed above, some components of an interferometric modulator 722, for example, the mechanical layer 724, are susceptible to damage on physical contact. Consequently, in these embodiments, the backplate 750 is unlikely to damage the array 720 and/or interferometric modulators 722 in the array in normal use.

In other embodiments, forces likely to be encountered in normal use of the device 700 are sufficient to cause the array 720 to contact the backplate 750, typically, at or near the center of the backplate 750 and array 720. For example, those skilled in the art will understand that, all other things remaining equal, as the length and/or width of the device 700 increase (along the x and/or y axes as illustrated in FIG. 7A), the relative movement between the array 720 and backplate 750 will also increase. The length and/or width of a device 700 will increase, for example, with increasing size and/or number of the interferometric modulators 722 in the array 720. At some point, a force likely to be encountered in the normal use of the device 700 will induce a relative motion that will cause some part of the array 720 to contact the backplate 750, thereby potentially damaging one or more of the interferometric modulators 722 in the device. In some embodiments, the increased likelihood of contact between the array 720 and the backplate 750 is counteracted by increasing the distance between the array 720 and the backplate 750. In some embodiments, the increased likelihood of contact between the array 720 and the backplate 750 is counteracted by increasing the rigidity of the device 700, for example, the substrate 710, backplate 750, and/or seal 740. Methods for increasing rigidity are known in the art, and include, for example, increasing the rigidity of a component, modifying the dimensions of a component, changing the shape or profile of a component, adding reinforcement, and the like.

In some embodiments, the increased likelihood of contact between the array 720 and the backplate 750 is counteracted by increasing the distance between the array 720 and inner surface 752 of the backplate. Some embodiments of the device use a backplate 850 as illustrated in FIG. 8A in which the inner surface 852 is concave, thereby increasing the distance between the center 858 of the backplate and the array 820. Referring to FIG. 7B, increasing the distance between the inner surface of the backplate 752 and the array 720 will tend to increase the thickness of the device 700, particularly if components in the device are also made thicker to increase rigidity. In some applications, a thicker device 700 is undesirable.

Accordingly, some embodiments of the device 700 comprise one or more spacers 730 disposed between the array 720 and the backplate 750. The spacer(s) 730 are configured to prevent and/or reduce contact between the array 720 and the backplate 750 when the device 700 is subjected to a deforming force, thereby eliminating and/or reducing damage to the interferometric modulators 722. In some embodiments, the backplate 750 comprises irregularities or features, for example, reinforcing ribs and/or desiccant packages, as described above. The spacers 730 prevent an irregularity or feature from contacting the mechanical layer 724 of the array, either directly (e.g., the feature contacting the spacer) or indirectly (e.g., some other part of the backplate contacting the spacer, preventing the feature from contacting the mechanical layer 724). In some of these embodiments, the surface of the spacer 720 proximal to the array 720 is substantially smooth. In some embodiments, the spacers 730 distribute an applied force, thereby reducing the likelihood that the force will damage any particular interferometric modulator 722. For example, in some embodiments, a spacer 730 distributes an applied force to the posts 726 of the interferometric modulators, thereby protecting the mechanical layer 724. In some embodiments, a spacer 730 reduces or prevents damage arising from relative lateral or tangential motion between the array 720 and backplate 750, for example, by sliding and/or rolling. For example, in some of these embodiments, the spacer 730 comprises one or more low friction surfaces. In some embodiments, the spacer has a circular cross section, for example, a sphere or rod. As discussed in greater detail below, in some embodiments, the spacer or spacers 730 are resilient, thereby absorbing and/or distributing an applied force. Moreover, even if the force were to damage a plurality of interferometric modulators 722 in the array 720, in some embodiments, damage distributed over the array 720 is less noticeable to a user than damage concentrated in a particular region of the array 720. In other embodiments, a spacer 730 is designed to concentrate the damage to a small number of interferometric modulators, for example, by using one or more spacers 730 of a particular size and/or shape. For example, in some embodiments, the array 720 comprises redundant pixels such that disabling an isolated pixel is not noticeable to an end user. Accordingly, in these embodiments, the spacer 730 concentrates damage to a single pixel rather than to a group of neighboring pixels, which would be noticeable to the end user.

Figure 11A:
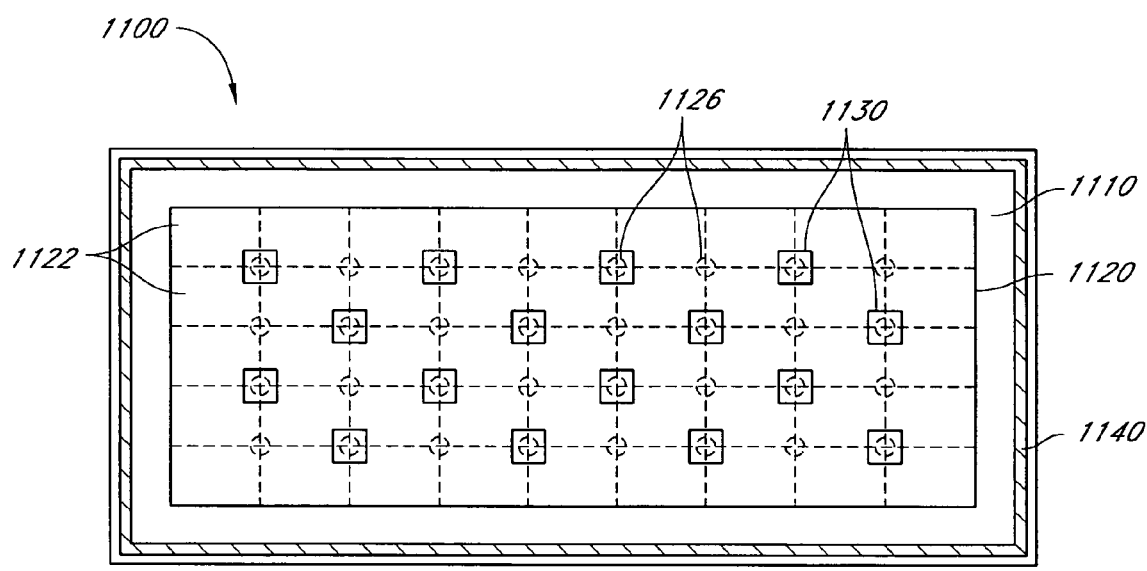
FIG. 11A illustrates a top view of an embodiment of a device in which the spacers are arranged in a substantially regular pattern.

FIG. 11A is a top view of the device 1100 illustrating the relative positioning of the spacers and the array. As discussed above, in some embodiments, the spacers contact the array, in other embodiments the spacers contact the backplate, and in other embodiments, the spacers contact the array and the backplate. The device 1100 comprises a plurality of spacers 1130 arranged in a substantially regular pattern over an array 1120 of interferometric modulators formed on a substrate 1110. In the illustrated embodiment, the spacers 1130 are positioned substantially above posts 1126 of the interferometric modulators. As shown in both FIG. 11A in which the posts 1126 are illustrated in phantom, in the illustrated embodiment, a spacer 1130 is not positioned over every post 1126. In some embodiments, the spacers 1130 are positioned above the array 1120. In some embodiments, the spacers 1130 are positioned in the space 110 between the array 1120 and a seal 1140. In some embodiments, the spacers 1130 are positioned both above the array 1120 and in the space 1110 between the array 1120 and the seal 1140. Those skilled in the art will understand that other spacings and/or patterns for the spacers 1130 are possible.

Figure 11B:
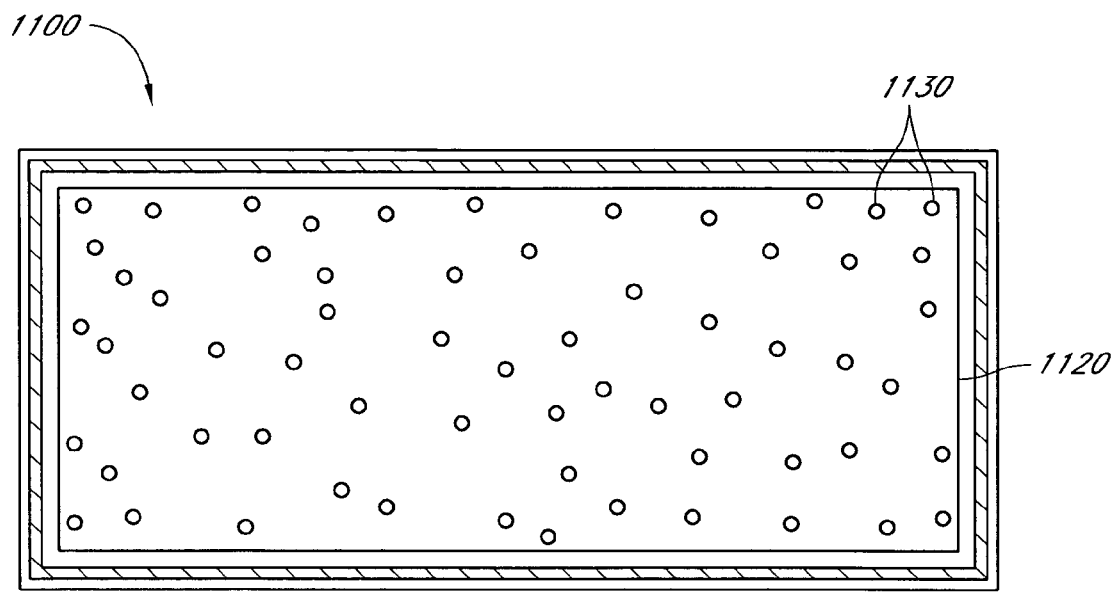
FIG. 11B illustrates a top view of an embodiment of a device in which the spacers are arranged in a random pattern.
Figure 11C:
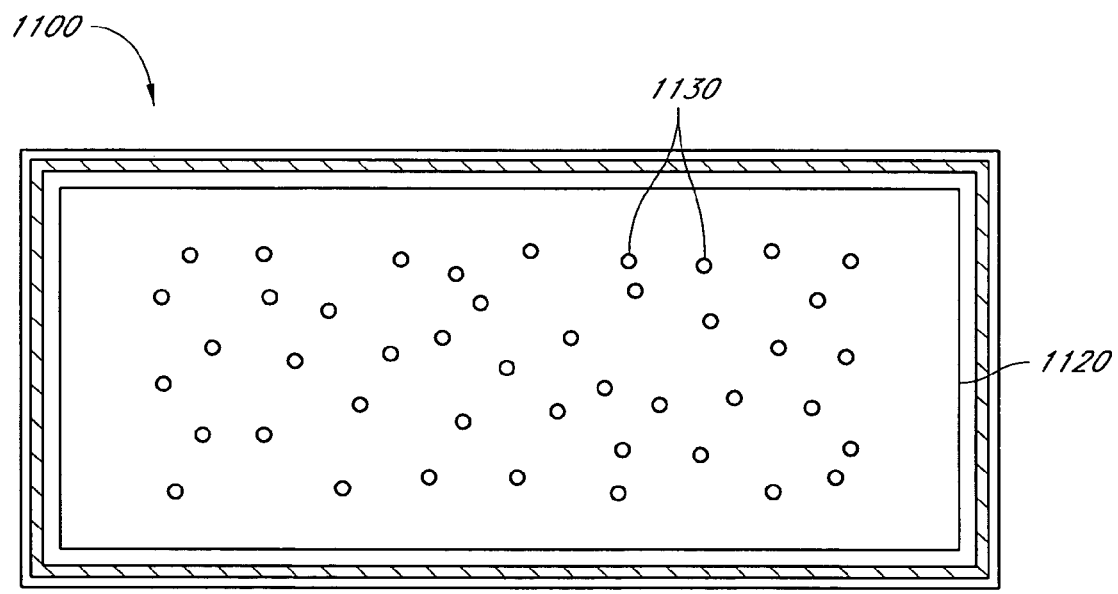
FIG. 11C illustrates a top view of an embodiment of a device in which the spacers are arranged around the center of the array.
Figure 11D:
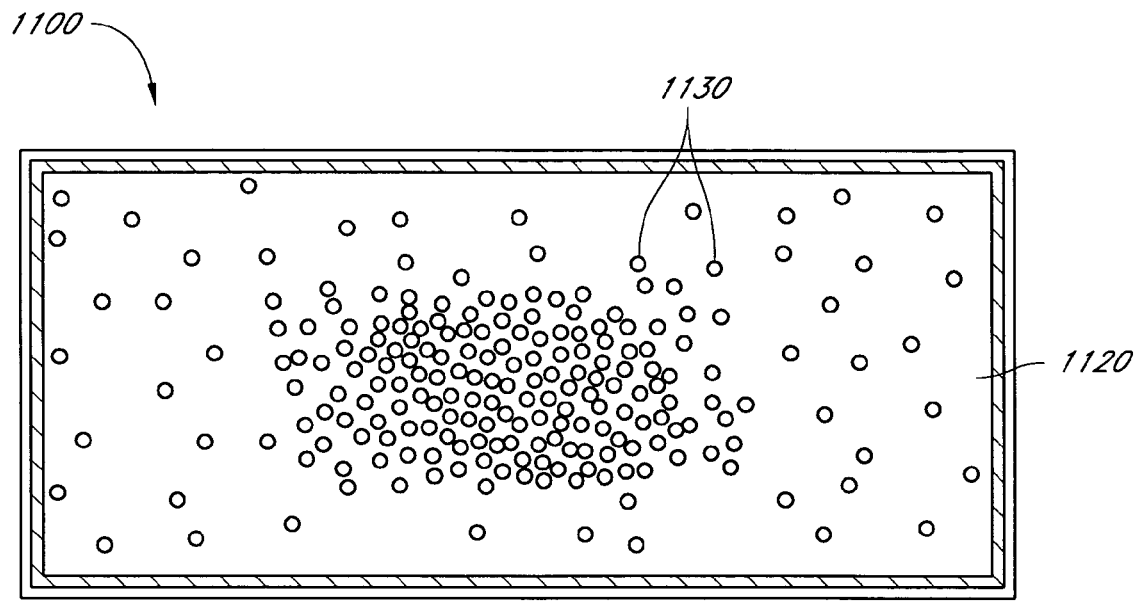
FIG. 11D illustrates a top view of an embodiment of a device in which the spacers are more dense around the center of the array and less dense around the periphery.
Figure 11E:
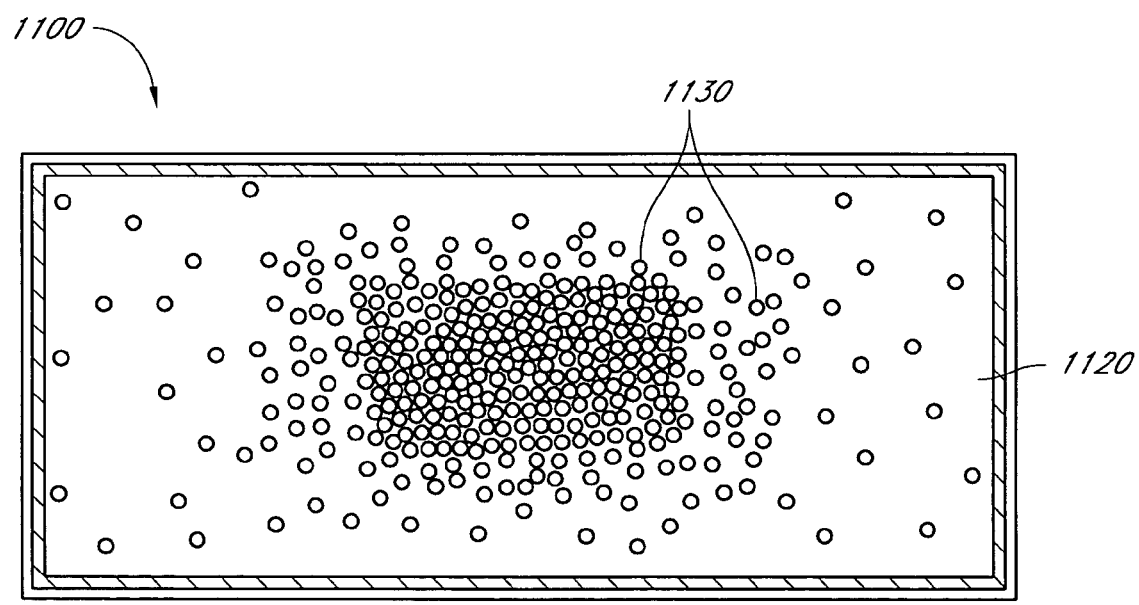
FIG. 11E illustrates a top view of an embodiment of a device comprising three concentric zones of spacers.

FIG. 11B illustrates a top view of another embodiment of a device 1100 in which the spacers 1130 are arranged substantially randomly over the array 1120. In the embodiment of the device 1100 illustrated in FIG. 11C, spacers 1130 are provided around the center of the array 1120, but not around the periphery. The embodiment of the device 1100 illustrated in FIG. 11D comprises a denser arrangement of spacers 1130 around the center of the array 1120 and a sparser arrangement around the periphery. The embodiment of the device 1100 illustrated in FIG. 11E comprises three concentric zones of spacers 1130 with increasing density towards the center of the array 1120. Those skilled in the art will understand that other arrangements are possible.

The spacers are of any suitable size, shape, and material. In some embodiments, all of the spacers are of the same type. Other embodiments comprise spacers of different types, for example, different sizes, shapes, and/or materials. The particular dimensions for a spacer will depend on factors known in the art including the material from which the spacer is made, the headspace between the array and the backplate, the intended application for the display package, and the like. In some embodiments, the thickness of the spacer is similar to the headspace between the array and the backplate. In other embodiments, the thickness of the spacer is less than the headspace between the array and the backplate. The dimensions of the headspace are discussed above.

Suitable materials for the spacers include rigid materials and/or elastomeric materials. In some embodiments, the spacers comprise a material capable of absorbing at least a portion of a force applied thereto, for example, by deformation. In some embodiments, the spacer is elastic and returns to substantially the original shape after the deforming force is removed. In other embodiments, the spacer permanently deforms in absorbing the force applied thereto. Examples of suitable materials include metals, steel, stainless steel, brass, titanium, magnesium, aluminum, polymer resins, epoxies, polyamides, polyalkenes, polyfluoroalkenes, polyesters, polysulfones, polystyrene, polyurethanes, polyacrylates, ceramics, glass, silica, alumina, and blends, copolymers, alloys, and/or composites thereof. In some embodiments, the spacer is a composite, for example, comprising a core of one material and a coating of another. In some embodiments, the spacer comprises a core of a rigid material, for example a metal, and a coating of an elastomeric material, for example, a polymer resin. In some embodiments in which an image is viewable through the backplate, the spacers are transparent or translucent. In some embodiments, the spacers are electrically conductive.

In some embodiments, the spacers comprise a desiccant of any type known in the art, for example, metal oxides, calcium oxide, barium oxide, boric anhydride, phosphorus pentoxide, metal sulfates, calcium sulfate, magnesium sulfate, sodium sulfate, metals, sodium, lead/sodium alloy, metal hydrides, sodium borohydride, sodium hydride, lithium aluminum hydride, silica gel, activated alumina, zeolites, molecular sieves, phosphorus, metal salts, magnesium perchlorate, zinc chloride, carbon nanotubes, and combinations thereof. In some embodiments, the spacer substantially comprises a desiccant. In other embodiments, the spacer comprises a composite in which the desiccant is a component. In some embodiments, the desiccant is distributed throughout the composite. In other embodiments, the desiccant is concentrated in one portion of the spacer, for example in a core. The other component or components in the composite are any suitable material, for example, the materials disclosed above as suitable for a spacer. In some embodiments, for example, in embodiments in which the spacer comprises a desiccant core, another material, for example, a coating over the desiccant, is a material that is permeable to water and/or water vapor, thereby facilitating the absorption of water by the desiccant. In some embodiments, the coating comprises one or more openings, for example, made by abrading the coating or through the manufacturing process of the spacer, to permit contact between the desiccant in the core and the ambient atmosphere.

Spacers are manufactured using methods known in the art, which will depend upon factors know in the art, including the material or materials from with the spacers are made, the size and shape of the spacers, the tolerances for the spacers. In some embodiments, the spacers are applied as a fluid, for example, a liquid, a gel, and/or a paste, which is then cured to form the spacers. Examples of suitable fluid materials include, for example, adhesives and photoresists. Those skilled in the art will understand that curing conditions depend on the particular material, and include thermal curing, photocuring, UV curing, and/or radiation curing.

Figure 12K:
FIG. 12A-FIG. 12T illustrate embodiments of spacers.
Figure 12L:
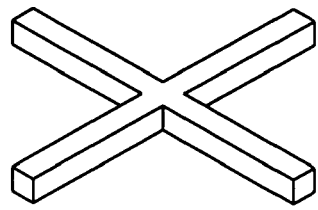
Figure 12M:
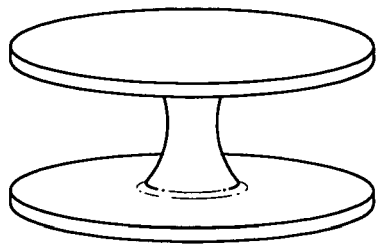

In other embodiments, the spacers are pre-manufactured. Embodiments of pre-manufactured spacers are illustrated in FIG. 12A-FIG. 12T. Those skilled in the art will understand that the illustrated shapes are exemplary and that other shapes are possible. For example, in some embodiments, the spacers are irregularly shaped. In some embodiments, the spacers are substantially solid. In other embodiments, the spacers comprise one or more voids. For example, in some embodiments, the spacer comprises one or more hollow regions. In some embodiments, the spacer comprises a plurality of voids, for example, an open-cell or closed-cell foam. Spherical and rod-shaped spacers illustrated in FIG. 12D and FIG. 12I, respectively, are commercially available in glass, silica, and/or polystyrene. For example, glass rod-shaped spacers are commercially available from Nippon Electric Glass Co. (Otsu, Shiga, Japan) in diameters of from about 1.5 µm to about 60 µm. Plastic spherical spacers are commercially available, for example, from Sekisui Chemical Co. (Osaka, Japan) in diameters of from about 5 µm to about 350 µm. Some embodiments use such spacers for reasons of availability, uniformity, and/or cost. Other shapes, for example, squares and circles, are also readily manufactured, and are used in other embodiments.

Figure 12N:
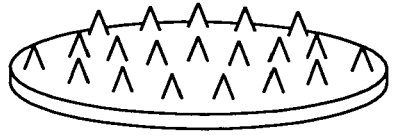
Figure 12O:
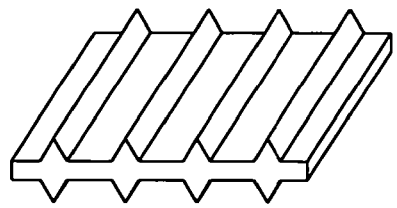
Figure 12P:
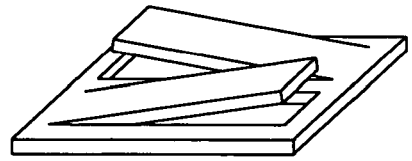
Figure 12Q:
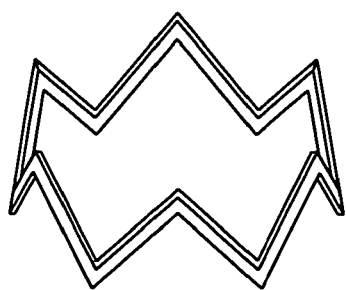
Figure 12R:
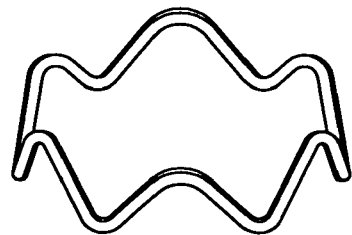
Figure 12S:
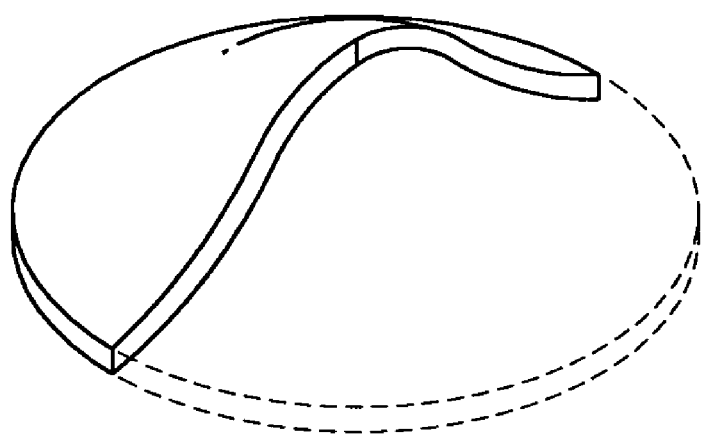
Figure 12T:
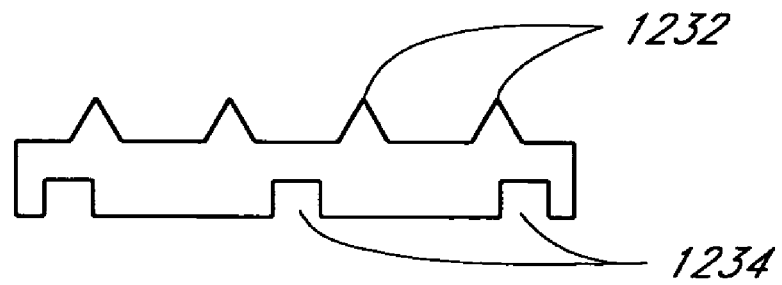

In some embodiments, the spacer comprises one or more projections and/or indentations, for example, as illustrated in FIG. 12N-FIG. 12T. In some embodiments, the projections and/or indentations engage a structure or feature on the array and/or backplate, as discussed in greater detail below. In some embodiments, the projections and/or indentations are designed to absorb at least some of the force applied to the device. For example, some embodiments comprise springs, as illustrated in FIG. 12P-FIG. 12S. Some embodiments comprise projections, as illustrated in FIG. 12N, FIG. 12O, and FIG. 12T, which are discussed in greater detail below. The embodiment illustrated in FIG. 12T comprises both projections 1232 and indentations 1234.

Figure 13A:
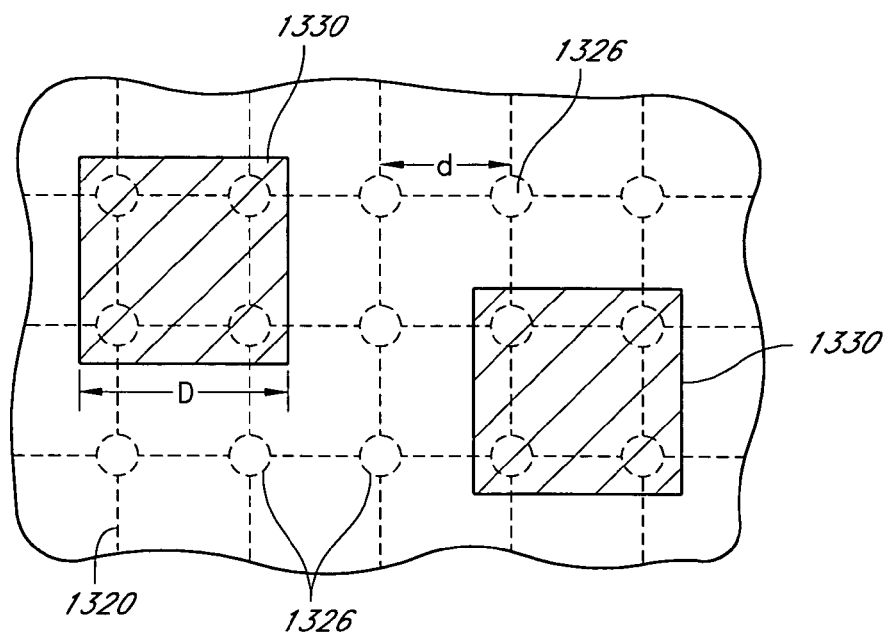
FIG. 13A illustrates a top view of an embodiment of a device comprising spacers that span at least two posts in the array.
Figure 13B:
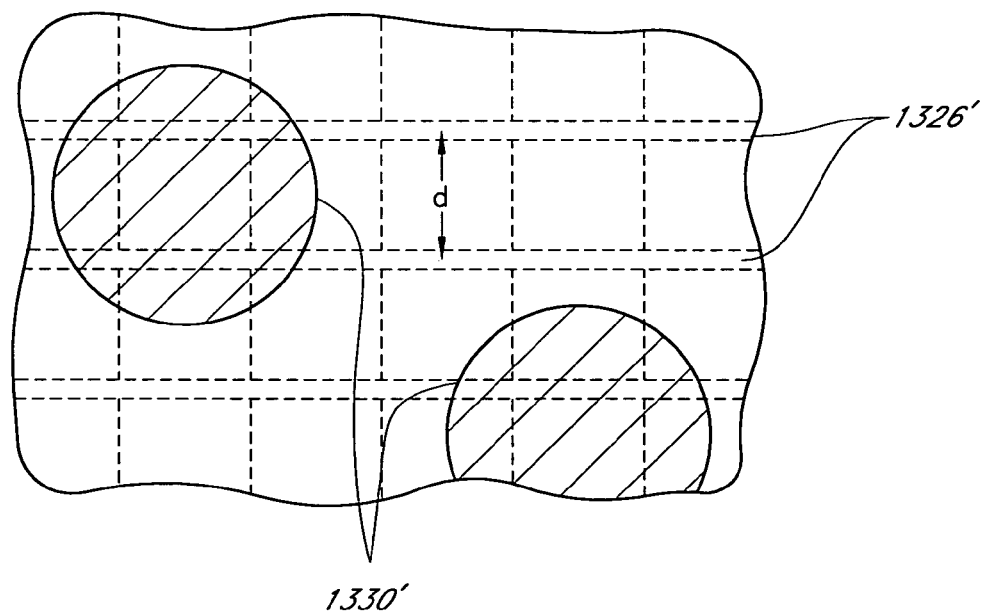
FIG. 13B illustrates a top view of an embodiment of a device comprising disk-shaped spacers that span at least two posts in the array.

In an embodiment illustrated in a top view in FIG. 13A, the spacer 1330 spans at least two posts 1326 of the array 1320 of interferometric modulators. In the illustrated embodiment, the shortest diameter D of the spacer 1330 is at least about twice the spacing d between the posts 1326, which ensures that the spacer always spans at least two posts 1326. In some embodiments, the spacing d is from about 30 µm to about 80 µm, for example, about 30 µm, 40 µm, 50 µm, 60 µm, or 30 µm. In other embodiments, the spacing d is larger, for example, up to 1 mm, or up to 5 mm. As discussed above, in some embodiments, the array 1320 comprises interferometric modulators 1322 with different dimensions, for example, widths, and consequently, the spacing between posts 1326 for adjacent interferometric modulators 1322 is not uniform. Consequently in some embodiments, the dimension D is at least the largest distance between the outer posts 1326 of adjacent interferometric modulators 1322. One embodiment of such an arrangement is illustrated in FIG. 13B, in which the posts 1326' have a different design than those illustrated in FIG. 13A and the spacers 1330' are disk-shaped.

Figure 14:
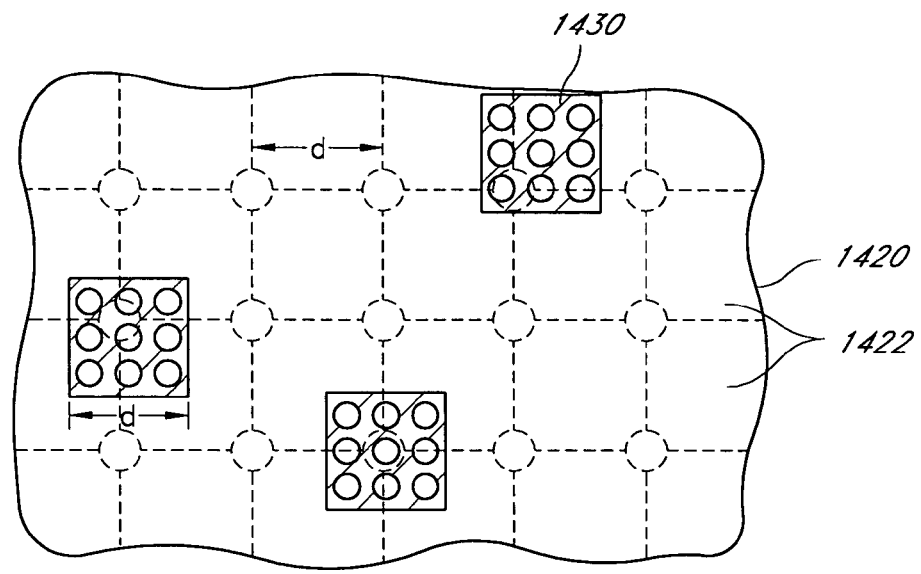
FIG. 14 illustrates a top view of an embodiment of a device comprising spacers at least as large as an interferometric modulator element in an array.

In an embodiment illustrated in FIG. 14, the spacer 1430 is at least a large as an interferometric modulator 1422, and consequently, is positioned at least over one post 1426. In the illustrated embodiment, the spacer 1430 is a perforated square. Interferometric modulator sizes are discussed above.

Figure 15A:
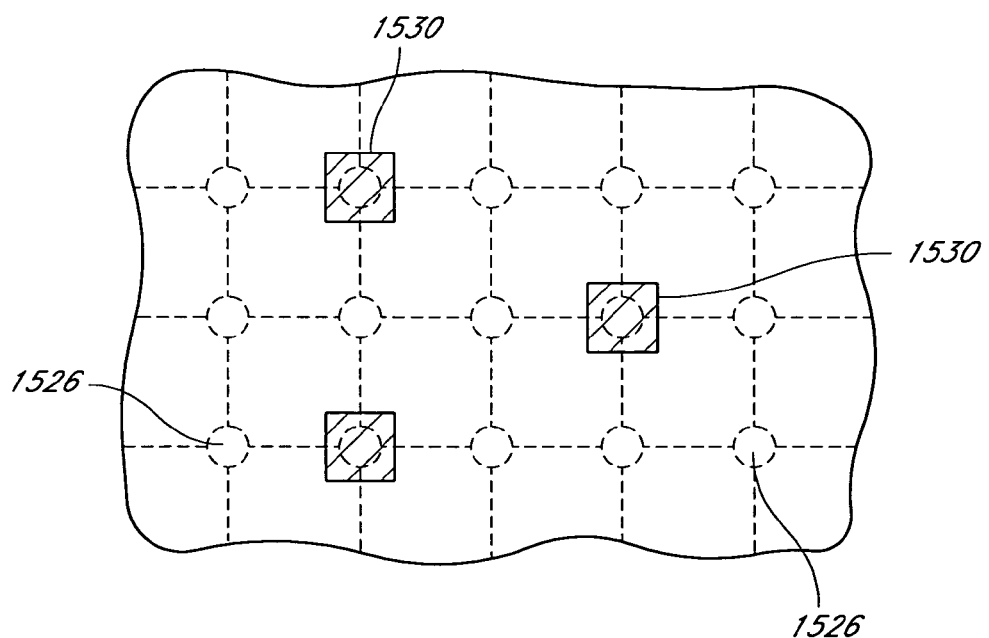
FIG. 15A illustrates a top view of an embodiment of a device comprising spacers substantially centered over the posts.
Figure 15B:
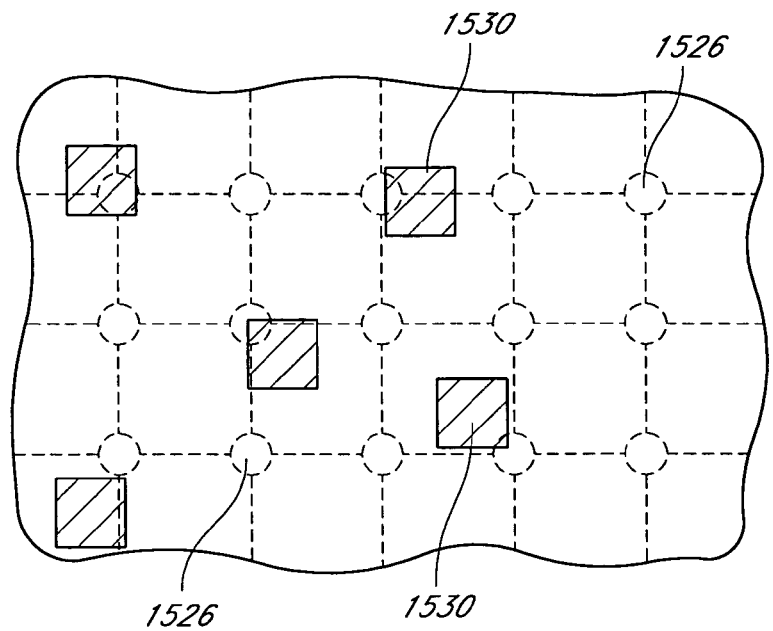
FIG. 15B illustrates a top view of an embodiment of a device wherein a portion of each spacer is positioned over a post.
Figure 15C:
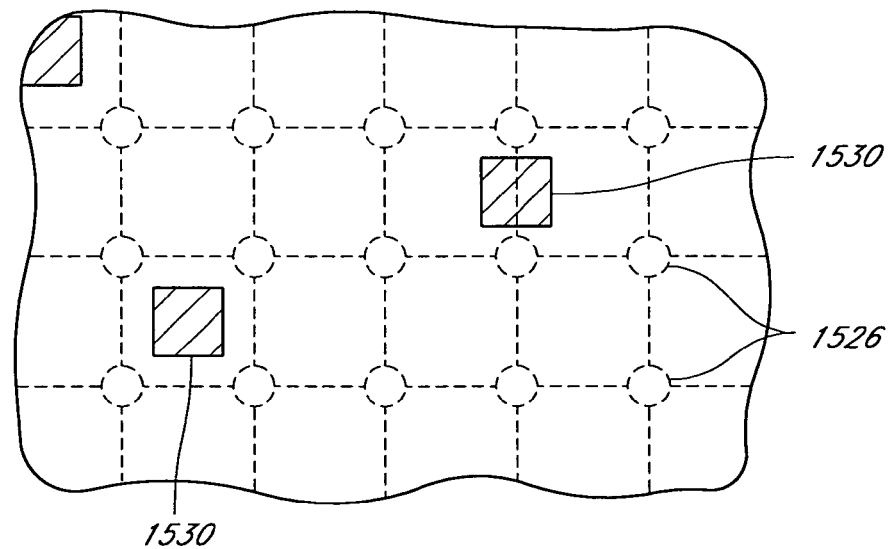
FIG. 15C illustrates a top view of an embodiment of a device wherein no portion of any spacer is positioned over a post.

In the embodiment illustrated in FIG. 15A, each spacer 1530 is substantially centered over a post 1526. In the embodiment illustrated in FIG. 15B, a least a portion of each spacer 1530 is positioned over a post 1526. In the embodiments illustrated in FIG. 15C, no portion of each spacer 1530 is positioned over a post 1526. Other embodiments, not illustrated, include any combination of these arrangements.

Figure 16:
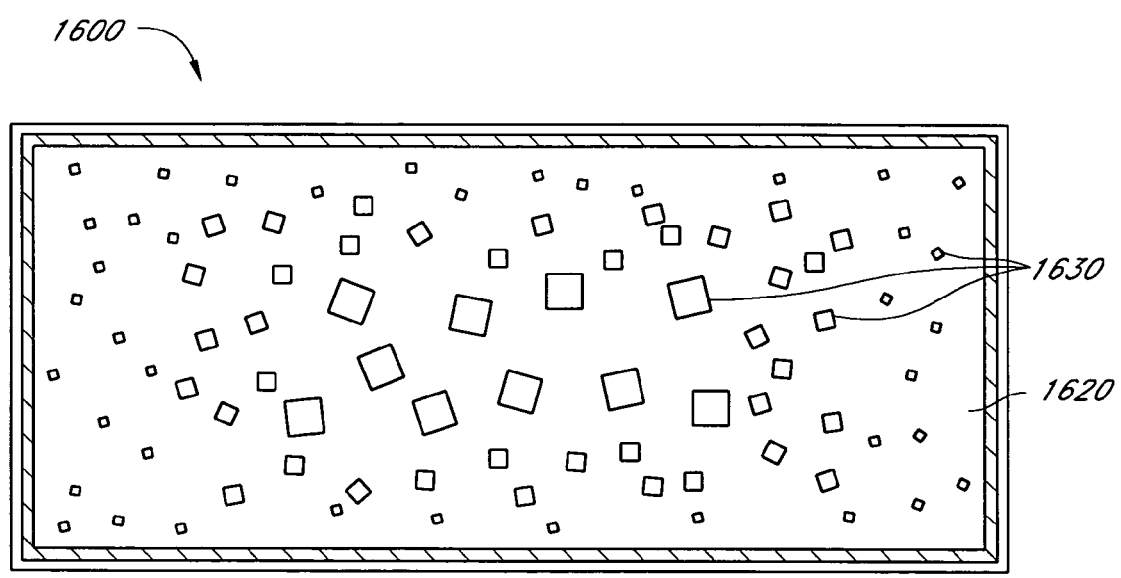
FIG. 16 illustrates a top view of an embodiment of a device comprising spacers of different sizes.

The embodiment of the device 1600 illustrated in FIG. 16 comprises spacers 1630 of different sizes positioned substantially over the array 1620.

Figure 17A:
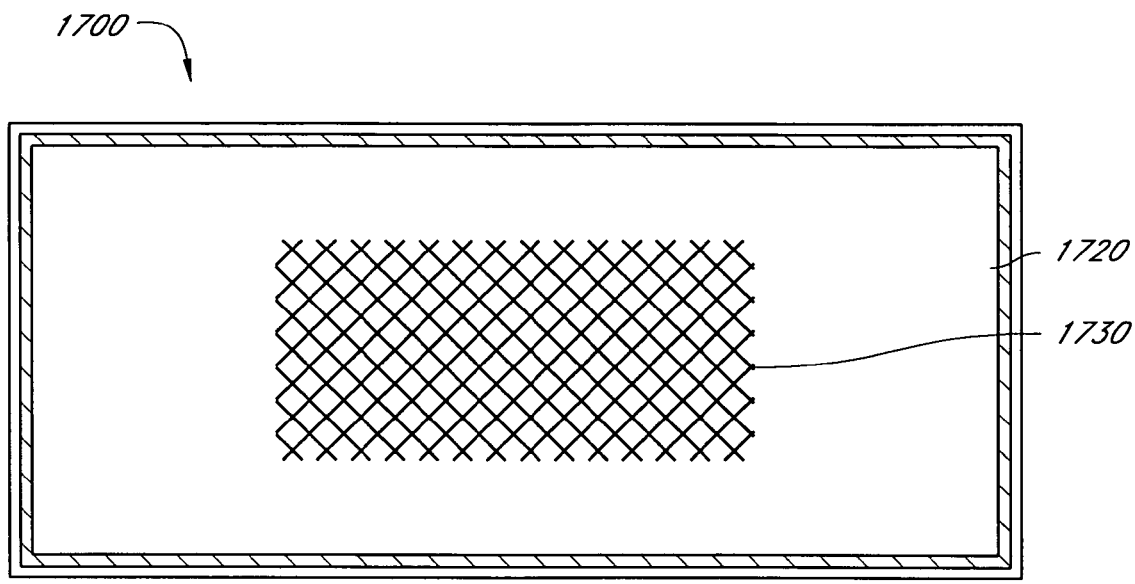
FIG. 17A illustrates a top view of an embodiment of a device comprising a mesh spacer.
Figure 17B:
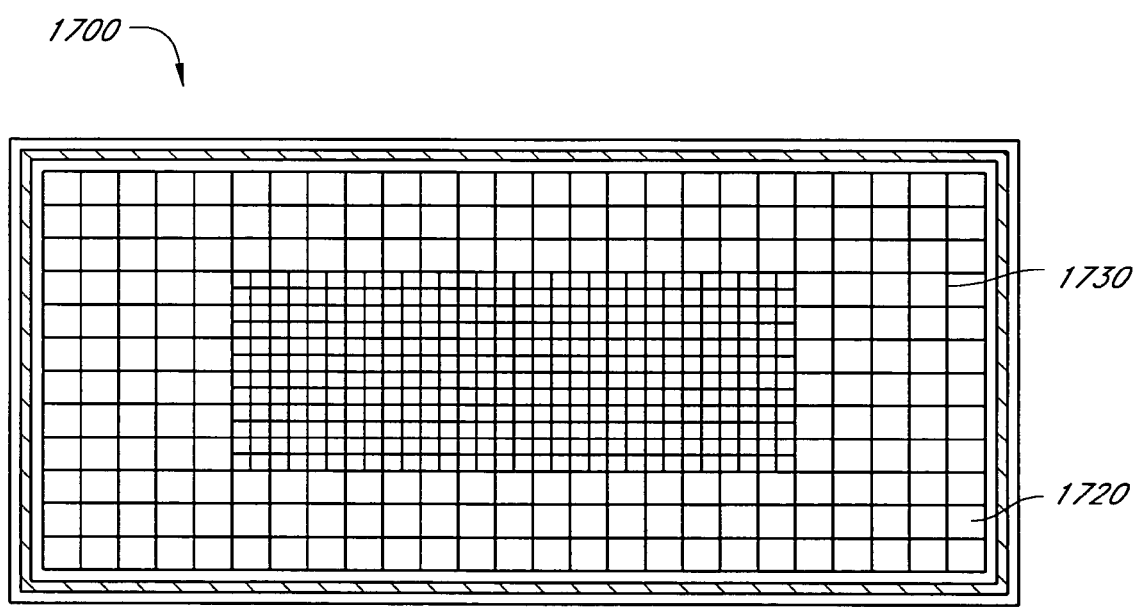
FIG. 17B illustrates a top view of an embodiment of a device comprising a mesh spacer that is denser at the center than at the periphery.
Figure 17C:
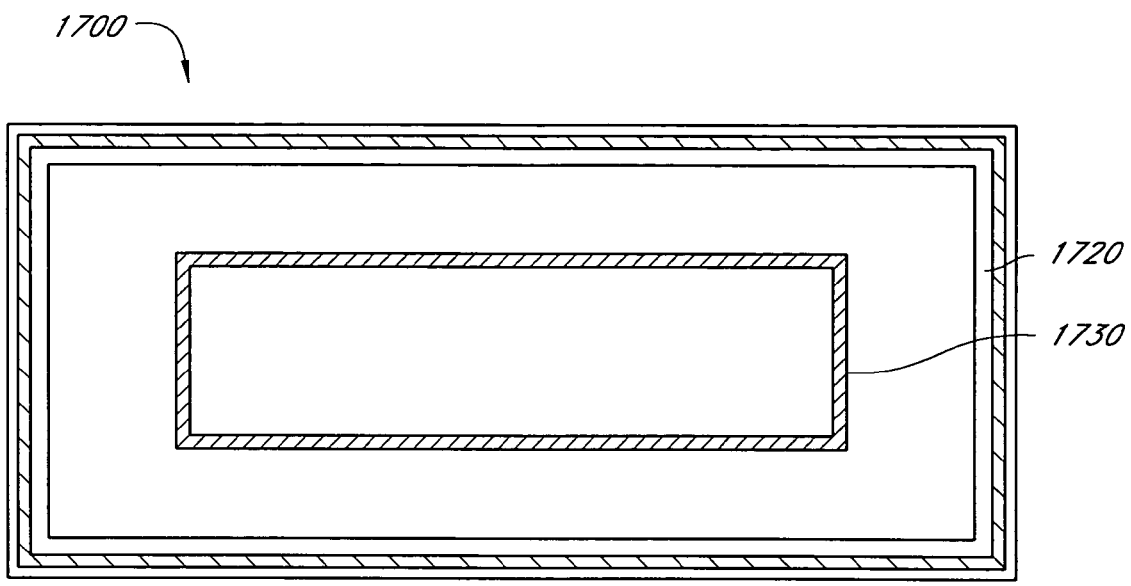
FIG. 17C illustrates a top view of an integrated rectangular spacer.
Figure 17D:
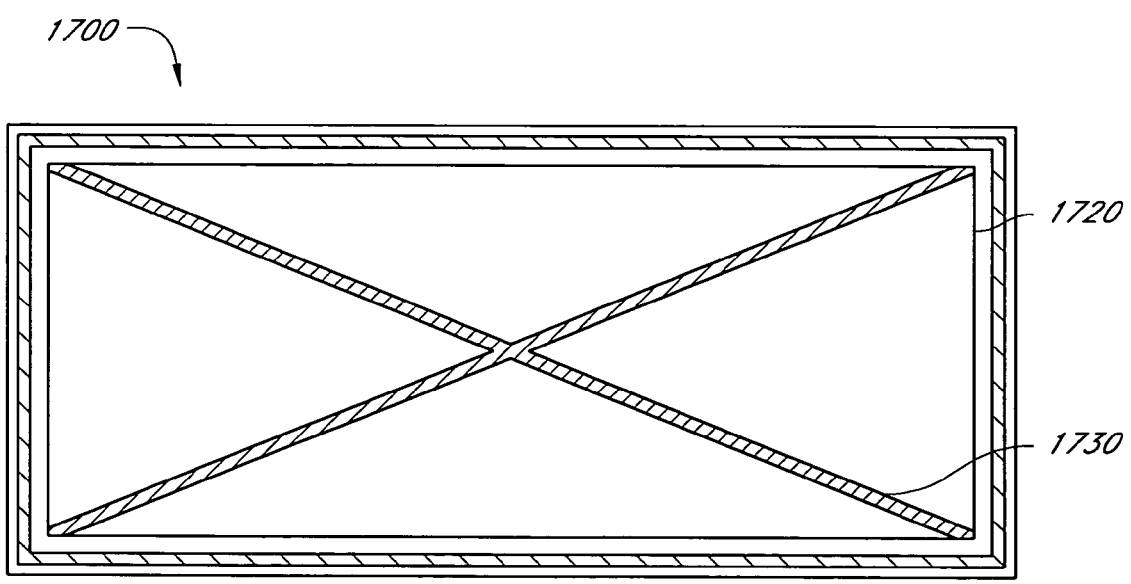
FIG. 17D illustrates a top view of an integrated diagonal spacer.

Some embodiments comprise one or more integrated spacers, either used alone or in combination with other spacers disclosed herein. FIG. 17A illustrates an embodiment of a device 1700 that comprises a spacer 1730 in the form of a mesh positioned over the center portion of the array 1720. FIG. 17B illustrates an embodiment of a device 1700 that comprises a mesh spacer 1730 that is denser around the center than around the peripheral portion. FIG. 17C illustrates an embodiment of a device 1700 in which the spacer 1730 is roughly an open rectangle substantially centered over the array 1720. FIG. 17D illustrates an embodiment of a device 1700 in which the spacer 1730 is substantially defined by the diagonals of the array 1720. In some embodiments, the spacer is thicker in one or more regions and thinner in one or more regions. For example, in some embodiments, the spacer is thicker in the central region and thinner around the periphery. In some embodiments, the spacer 1730 comprises a desiccant, as discussed above. For example, in some embodiments, the spacer 1730 comprises a core of a desiccant surrounded by an outer layer, for example, a polymer resin. In other embodiments, a desiccant is embedded into the spacer material.

Figure 18A:
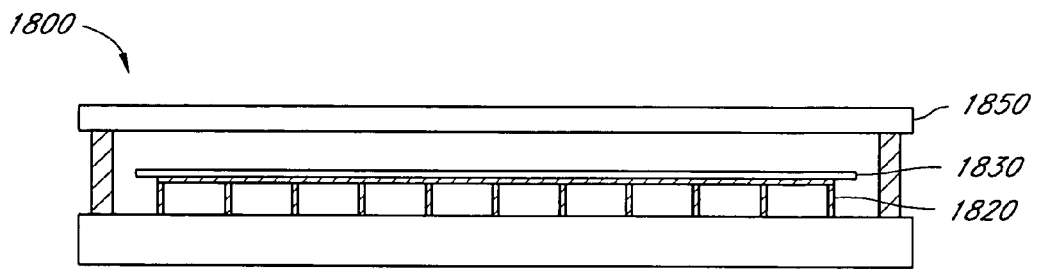
FIG. 18A illustrates a cross section of an embodiment of a device comprising a film spacer.

An embodiment 1800 illustrated in FIG. 18A comprises a spacer 1830 in the form of a film disposed between the array 1820 and the backplate 1850. In the illustrated embodiment, the spacer 1830 extends beyond the array 1820. In other embodiments, the spacer 1830 does not extend beyond the array 1820. In some embodiments, the spacer 1830 is substantially coextensive with the array 1820. In other embodiments, the spacer 1830 does not cover the entire array 1820.

Figure 18B:
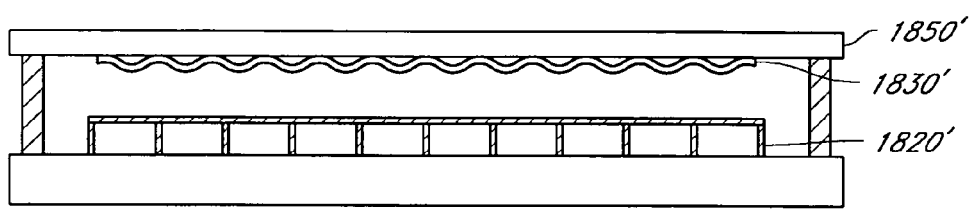
FIG. 18B illustrates a cross section of an embodiment of a device comprising a film spacer with a non-planar cross section.
Figure 18C:
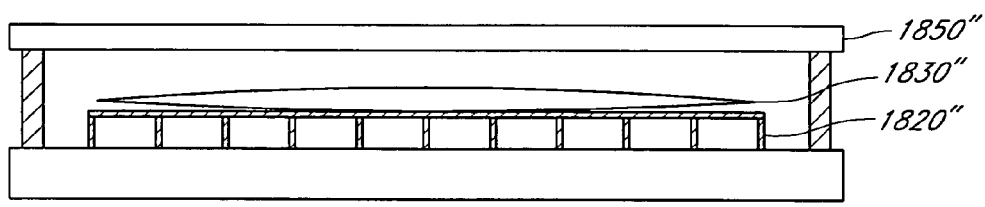
FIG. 18C illustrates a cross section of an embodiment of a device comprising a film spacer in the form of a bag.

In some embodiments, the film is substantially a flat film. In some embodiments, the film is from about 5 µm to about 50 µm thick, for example, from about 10 µm to about 20 µm thick. In other embodiments, the film is thicker. In some embodiments, the film is sufficiently thick to substantially fill the space between the array and backplate. In some embodiments, the film comprises a resilient material, for example, a foam. In some embodiments, the foam has a covering, for example, a non-permeable polymer, which in some embodiments, comprises perforations. In other embodiments, the film has a different shape. FIG. 18B illustrates a spacer 1830' in the form of a film with a non-planar cross section, for example, corrugated or an "egg-crate" shape, which absorbs at least some of the deforming force when compressed between the array 1820' and the backplate 1850'. Those skilled in the art will understand that a non-planar film is thicker than the corresponding planar film. In some embodiments, the film spacer comprises areas of varying properties, for example, thickness, compositions (e.g., composites), projections, indentations, and the like. In other embodiments, one or both faces of the film further comprises additional spacers as described above, for example, the spacers illustrated in FIG. 12A-FIG. 12T. In some embodiments, the film and spacers are formed as an integrated unit. In other embodiments the spacers and film are fabricated separately and joined in a separate step. In some embodiments, the film is perforated. For example, some embodiments of the spacers illustrated in FIG. 17A and FIG. 17B are perforated films. FIG. 18C illustrates an embodiment in which the spacer 1830" is a sealed bag enclosing a volume of gas disposed between the array 1820" and the backplate 1850". Those skilled in the art will understand that the particular film selected for an application will depend on factors including the thickness of the film, its mechanical properties, its shape and configuration, the headspace between the array and backplate, and the anticipated use of the display package.

In some embodiments, the film comprises a desiccant. In some embodiments, the film is a desiccant. In other embodiments, the film, for example, a polymer resin film, is impregnated with a desiccant. In still other embodiments, the film comprises a thin layer of desiccant that is encapsulated, for example, using a polymer resin.

Some embodiments comprise a planar film spacer in contact with the array or a portion thereof in order to distribute forces over a larger area. In some embodiments, one or more other spacers as disclosed herein are positioned between the film and the backplate, and/or between the film and the array, for example any of the spacers described above.

Figure 19:
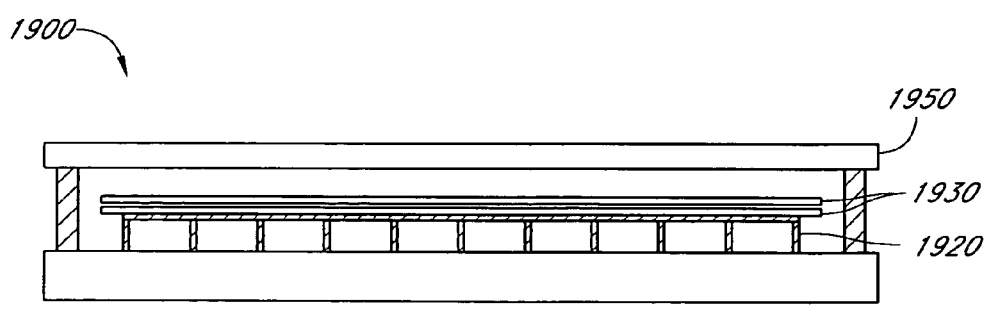
FIG. 19 illustrates a cross section of an embodiment of a device comprising a plurality of film spacers.

FIG. 19 illustrates an embodiment 1900 comprising a plurality of film spacers 1930 disposed between the array 1920 and the backplate 1950. The film spacers are as described above. Some embodiments comprise a combination of a planar film spacer and a non-planar film spacer, for example, with the planar film spacer contacting the array 1920 as described above. Some embodiments comprise at least two non-planar film spacers arranged such that the spacers do not nest, for example, a pair of corrugated films arranged with the corrugations at right angles. Some embodiments comprise at least two non-planar film spacers with a planar film spacer disposed in-between thereby preventing the non-planar spacers from nesting.

Figures 20A, 20B, 20C, 20D:
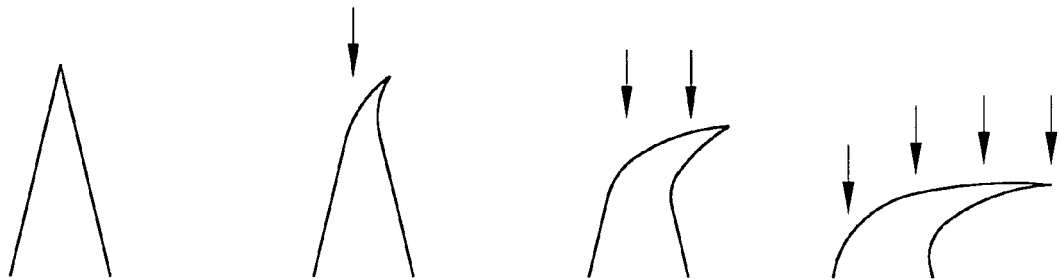
FIG. 20A-FIG. 20D illustrate in cross section the response of an embodiment of a spacer with a triangular cross section to an applied force.
Figure 20E:
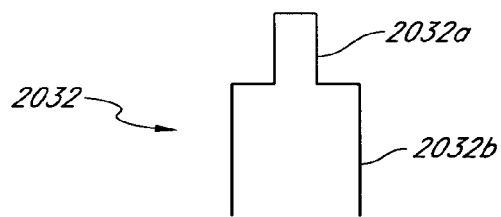
FIG. 20E illustrates an embodiment of a spacer with a thinner upper portion and a thicker lower portion.
Figure 20F:
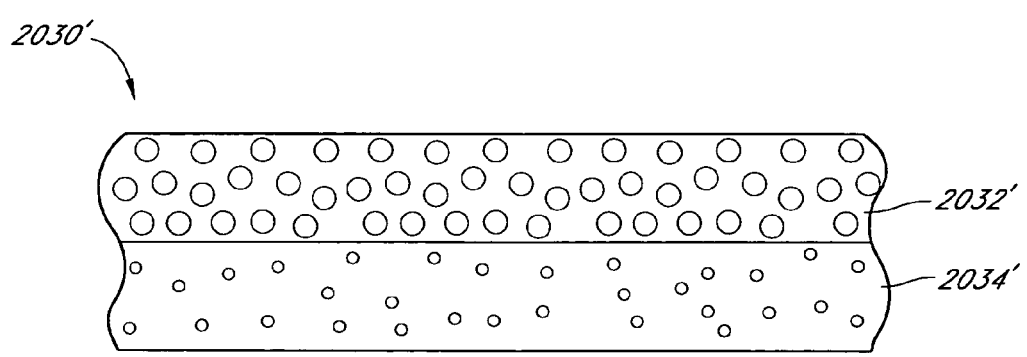
FIG. 20F illustrates a cross section of an embodiment of a spacer with two regions that respond differently to an applied force.

In some embodiments, the spacer or some portion thereof has a shape designed to provide a graded response to an applied force, for example, a spacer or portion thereof with a triangular cross section. An example of a portion of a spacer is provided FIG. 12T as projection 1232. A triangular portion of a spacer is illustrated in FIG. 20A. The triangular portion is relatively susceptible to small deformations, as illustrated in FIG. 20B, but becomes increasingly difficult to deform as illustrated in FIG. 20C and FIG. 20D. FIG. 20E illustrates another embodiment in which the spacer 2032 has two regions, each which has a different response to an applied force: a thinner upper portion 2032a and a thicker lower portion 2034b. In the embodiment illustrated in FIG. 20F, the spacer 2030' also has two response regions, an upper region 2032' that is has relatively more void space, and a lower region 2034' that has relatively less void space. In some embodiments, spacer comprises a composite that provides a graded response.

In some embodiments, one or more of the spacers is secured to the array. In other embodiments, one or more of the spacers is secured to the backplate. In other embodiments, one or more of the spacers is secured to both the array and the backplate. In other embodiments, a first set of one or more spacers is secured to the array, and a second set of one or more spacers is secured to the backplate. In other embodiments, one or more of the spacers is not secured to either the array or the backplate. In embodiments in which a spacer is secured to the array and or backplate, the spacer is secured using any method known in the art, for example, using an adhesive, mechanically, and/or by welding.

In embodiments using an adhesive, one or more adhesives is applied to the array and/or backplate using any method known in the art, for example, lithographically, inkjet printing, contact printing, and the like. A spacer or spacers is then applied to the adhesive. In some embodiments, the adhesive is applied to the spacer, which is then applied to the array and/or backplate, for example, by spraying, rolling, individual application, and the like. In other embodiments, the spacers are suspended in a liquid comprising the adhesive. The suspension of spacers is applied to the array and the liquid removed, for example, by evaporation. Examples of suitable liquids include lower alcohols, for example, methanol, ethanol, and isopropanol, as well as other volatile liquids, for example, acetone, methyl t-butyl ether, and ethyl acetate. As discussed above, in some embodiments, spacers are applied to a film, which is then applied to the array and/or backplate. In some embodiments, the spacer is integral to the array or backplate, as described in greater detail below. Spacers are secured to the backplate using substantially similar methods.

In some embodiments, one or more spacers are not secured to the array or the backplate. For example, in some embodiments using large spacers, for example, the mesh spacers illustrated FIG. 17A and FIG. 17B, the spacers illustrated in FIG. 17C and FIG. 17C, and/or the film spacers illustrated in FIG. 18A-FIG. 18C, and FIG. 19, the spacers are simply positioned on the array and/or backplate in the assembly of the package device.

In embodiments in which the spacers are smaller, for example, with sizes in the micrometer to hundreds of micrometer range, the spacers are conveniently positioned by suspending them in a fluid carrier and applying the suspended spacers to the array and/or backplate, for example, by spraying and/or spin coating. In some embodiments, the fluid carrier is a liquid that is easily removed, for example, under vacuum and/or by heating. Examples of suitable liquids are known in the art and include lower alcohols (e.g., methanol, ethanol, isopropanol), hydrocarbons (e.g., propane, butane, pentane), halogenated compounds (e.g., fluorocarbons, chlorofluorocarbons, hydrochlorofluorocarbons, chlorocarbons, hydrochlorocarons), ethers (e.g., methyl tert-butyl ether, diethyl ether, tetrahydrofuran), esters (e.g., ethyl acetate), ketones (e.g., acetone), and combinations thereof. In other embodiments, the fluid is a gas, for example, air or nitrogen. In some embodiments, the spacers tend to remain in position after the solvent is removed, even absent an added adhesive.

In some embodiments, the spacers are applied substantially only over the array, for example, by masking the area on which the seal is formed during the application of the spacers. In other embodiments, the spacers are applied over the array as well as other portions of the device, for example, over the area on which the seal is formed. In some of these embodiments, the spacers also define the thickness of the seal, thereby providing a uniform seal thickness. For example, disposing 20-μm spacers within the seal and contacting the substrate and backplate with the spacers provides a seal thickness of 20 μm.

Figure 21A:
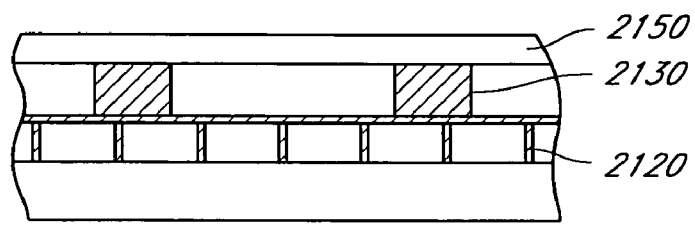
FIG. 21A illustrates a cross section of an embodiment of a device in which the spacer extends between the array and backplate.
Figure 21B:
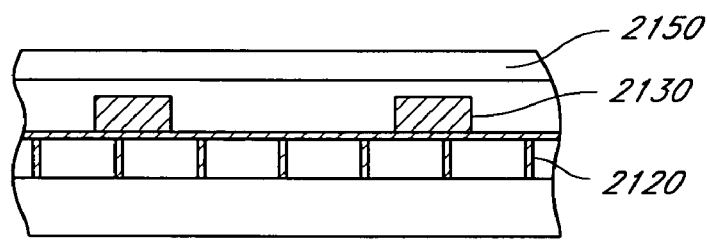
FIG. 21B illustrates a cross section of an embodiment of a device in which the spacer contacts the array but not the backplate.
Figure 21C:
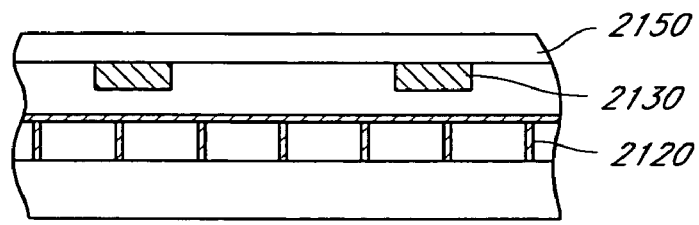
FIG. 21C illustrates a cross section of an embodiment of a device in which the spacer contacts the backplate but not the array.

As illustrated in FIG. 21A in some embodiments, one or more of the spacers 2130 extends between the array 2120 and backplate 2150. In the embodiment illustrated in FIG. 21B, the spacer 2130' contacts the array 2120', but does not contact the backplate 2150'. In the embodiment illustrated in FIG. 21C, the spacer 2130" contacts the backplate 2150", but does not contact the array 2120". Some embodiments comprise a combination of these configurations.

Figure 22A:
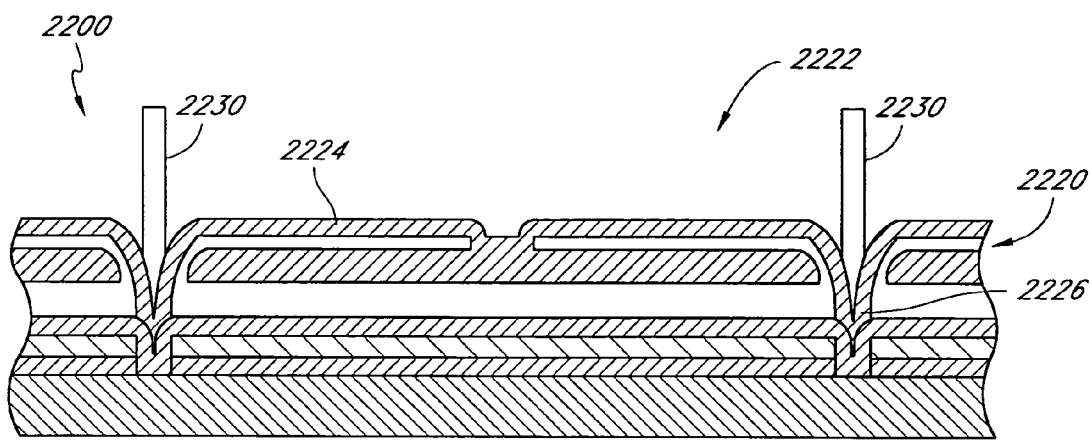
FIG. 22A illustrates a cross section of an embodiment of a device comprising integrated spacers formed over the posts of the interferometric modulators.

The embodiment illustrated in FIG. 22A is similar to the device illustrated in FIG. 6C. In embodiment 2200, the spacers 2230 are integrated with the array 2220 interferometric modulators. In the illustrated embodiment, the spacers 2230 are formed over the posts 2226 of the interferometric modulators 2222. In some embodiments, the process for forming the spacers 2230 is a thin-film process, and is integrated with the process for forming the interferometric modulators 2222, for example, as disclosed above and in U.S. Pat. No. 5,835, 255. In some embodiments, a spacer material is deposited on the mechanical layer 2224 prior to the removal of the sacrificial material (not illustrated) in the process for manufacturing the interferometric modulators 2222. The spacers 2230 are patterned and etched from the spacer material using methods known in the art. Those skilled in the art will understand that the particular method will depend on factors including the particular spacer material used, the other materials used in the manufacture of the interferometric modulators 2222, the geometries of the interferometric modulators 2222, and the like.

In some embodiments, the formation of the spacers 2230 is integrated in the process flow for forming interferometric modulators, for example, the process disclosed in U.S. Pat. No. 5,835,255. For example, a layer (not shown) of the spacer material is deposited on the mechanical layer 2224 before removal of a sacrificial material (not shown) occupying the cavity between the mirrors. The spacer layer is then etched to form the individual spacers 2230. In some embodiments, the spacer layer is patterned and etched so that a passage allowing gas communication to each cavity in an array 2220 of interferometric modulators is formed. The cavity is then formed by removing the sacrificial material through the passage.

In some embodiments, the integrated spacers are fabricated from a solid material with good shape retention that is not easily compressed. In some embodiments, the material is selected from the group consisting of metals, oxides, nitrides, photoresists, other organic materials, spin-on glass, and combinations thereof. In some embodiments, the spacers are electrically conductive. Those skilled in the art will understand that similar processes are useful in fabricating integrated spacers on the inner surface of the backplate.

Figure 22B:
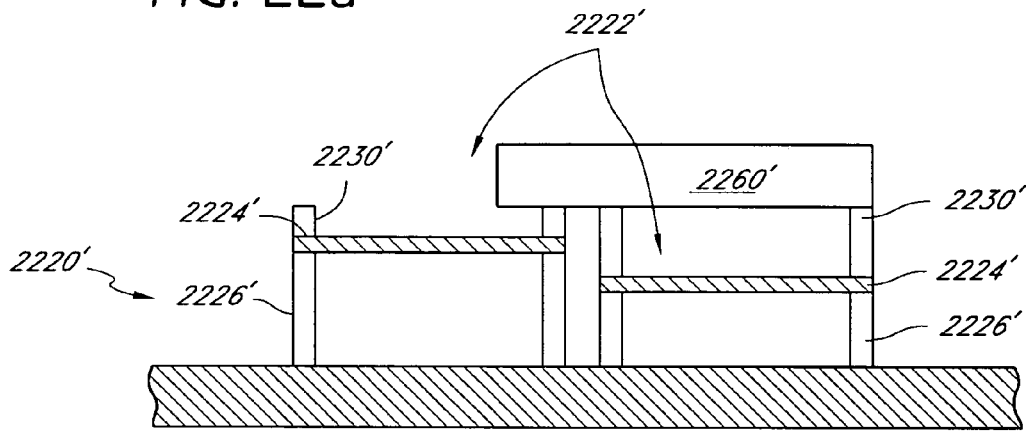
FIG. 22B illustrates a cross section of an embodiment of a device comprising integrated spacers formed over the posts of interferometric modulators of different heights and a second spacer disposed on the integrated spacers.
Figure 22C:
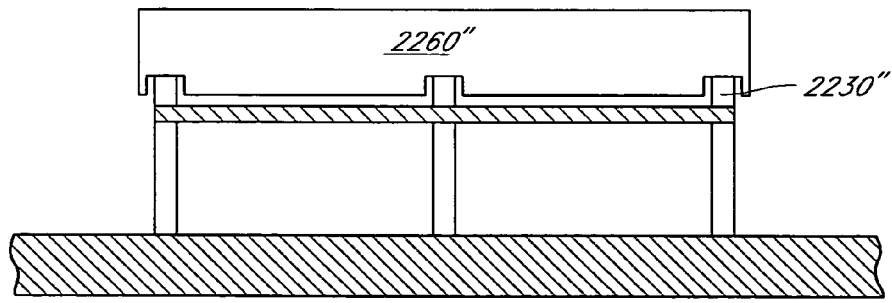
FIG. 22C illustrates a cross section of an embodiment of a device comprising integrated spacers formed over the posts of interferometric modulators and a second spacer that engages the integrated spacers.

As illustrated in FIG. 22B, in some embodiments, the array 2220' comprises interferometric modulators 2222' of different heights. In the illustrated embodiment, the first spacers 2230' compensate for the height differences, thereby providing a uniform platform supporting second spacers 2260' of any type disclosed above. In some embodiments, the second spacers 2260' are secured to the first spacers. In other embodiments, the second spacers 2260' are not secured to the first spacers. In the embodiment illustrate in FIG. 22C, the second spacers 2260" comprises indentations 2234" that engage the first spacers 2230".

Figure 23:
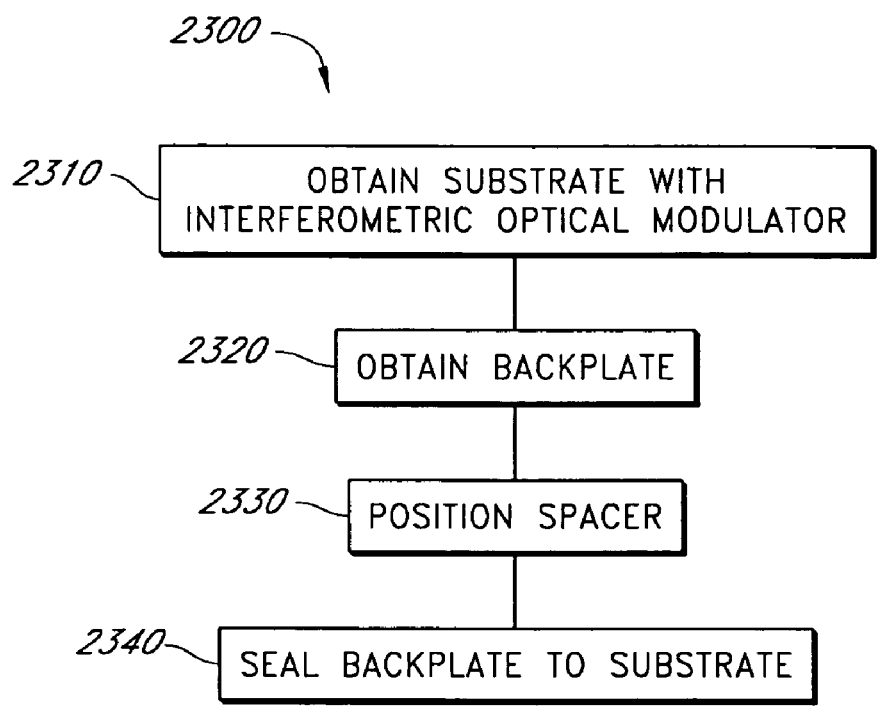
FIG. 23 is a flowchart illustrating an embodiment of a method for manufacturing an packaged electronic device that resists physical damage.

FIG. 23 is a flowchart illustrating a method for manufacturing a packaged electronic device with reference to the structure illustrated in FIG. 7A and FIG. 7B. In step 2310, a substrate 710 on which an interferometric modulator 722 has been formed is obtained. In some embodiments, the interferometric modulator 722 is part of an array 720 of interferometric modulators 722. In step 2220, a backplate 750 is obtained. In step 2230 one or more spacers 730 are disposed between the interferometric modulator 722 and the backplate 750. In step 2240, a seal 740 is formed between the substrate 710 and the backplate 750.

In some embodiments, the product of the manufacturing process is a panel comprising a plurality of package displays. The individual package displays are then cut from the panel. In the manufacturing process, a plurality of interferometric modulator arrays is formed on a single substrate (mother glass), as discussed above. A sheet comprising a plurality of backplates (typically equal in number to the interferometric modulator arrays) dimensioned and spaced to match the interferometric arrays is obtained. Spacers are disposed between the substrate and backplate as discussed above. Seals are formed between each array and backplate as discussed above, thereby forming a panel comprising a plurality of interferometric modulator arrays. The individual package displays are cut from the panel using any method known in the art, for example, by scribing.

Figure 24:
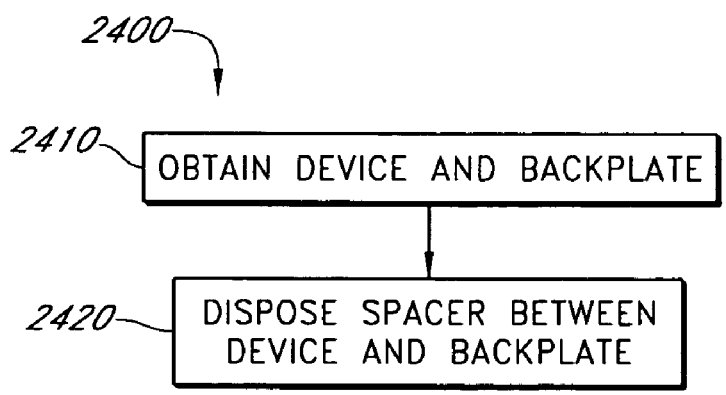
FIG. 24 is a flowchart illustrating an embodiment of a method for protecting an electronic device from physical damage.

FIG. 24 is a flowchart illustrating a method for protecting an electronic device with reference to the structure illustrated in FIG. 7A and FIG. 7B. In step 2410, a device comprising an interferometric modulator 722 formed on a substrate 710 and a backplate 750 is obtained. In step 2420, one or more spacers are disposed between the interferometric modulator 722 and the backplate 750.

EXAMPLE 1

Six 250 mm×300 mm interferometric modulator arrays are fabricated on a 680 mm×880 mm glass substrate. A glass sheet of six recessed caps, 7 mm thick, 252 mm×302 mm, 0.3 mm recess, is cleaned and dried. A thin film of a CaO desiccant (Hi Cap 2800, Cookson, London, UK) is applied to the recesses, fully cured, and prepared. A 1% by volume suspension of 10-μm diameter polystyrene rod spacers (Sekisui Chemical Co., Osaka, Japan) in isopropanol is sprayed evenly over the backplate to provide 2% coverage of spacers on the surface. The seal areas between the recesses are not masked. The isopropanol is removed by heating at 100° C. for 5 seconds. A bead of a UV curing epoxy (H5516, Nagase, Tokyo, Japan) is applied to the peripheries of the recessed cap backplates and the sheet aligned over the substrate. Pressure is applied to the sheet to provide a layer of epoxy with a 15 μm average thickness. The epoxy is cured by irradiating at 6000 mJ/cm$^2$ 350 nm (about 2 minutes), then baking at 80° C. for 30 min. Six interferometric modulator packages are cut from the resulting panel.

The embodiments illustrated and described above are provided as examples only. Various changes and modifications can be made to the embodiments presented herein by those skilled in the art without departure from the spirit and scope of the teachings herein.

What is claimed is:

1. A display package comprising:
   an array of interferometric modulators formed on a substrate;
   a backplate;
   a seal disposed between the substrate and the backplate, wherein the substrate, backplate, and seal together package the array of interferometric modulators; and
   at least one spacer disposed above the array and between the array and the backplate, wherein at least one of the spacers prevents the backplate from contacting the array, and wherein the at least one spacer does not contact one of the backplate and the array.

2. The display package of claim 1, wherein the substrate is at least partially transparent and/or translucent, and the interferometric modulators are configured to reflect light through the transparent and/or translucent portion of the substrate.

3. The display package of claim 1, wherein the backplate comprises a recessed cap.

4. The display package of claim 1, wherein the backplate comprises a glass backplate.

5. The display package of claim 1, wherein the backplate comprises a desiccant.

6. The display package of claim 1, wherein the seal comprises a hermetic seal.

7. The display package of claim 1, wherein the seal comprises a desiccant.

8. The display package of claim 1, wherein at least one spacer comprises a desiccant.

9. The display package of claim 1, wherein the spacers are regularly spaced.

10. The display package of claim 1, wherein the spacers are irregularly spaced.

11. A method for fabricating a display package comprising:
    providing an interferometric modulator array on a substrate;
    disposing one or more spacers above the array and between the array and a backplate; and
    sealing the backplate onto the substrate to form a display package, wherein at least one of the spacers prevents the backplate from contacting the array and wherein the one or more spacers do not contact one of the backplate and the array.

12. The method of claim 11, wherein said substrate is at least partially transparent and/or translucent, and the interferometric modulators are configured to reflect light through the transparent and/or translucent portion of the substrate.

13. The method of claim 11, wherein the backplate comprises a recessed cap.

14. The method of claim 11, wherein the backplate comprises a glass backplate.

15. The method of claim 11, wherein the backplate comprises a desiccant.

16. The method of claim 11, wherein sealing a backplate onto the substrate forms a hermetic seal.

17. The method of claim 11, wherein the at least one of the spacers comprises a desiccant.

18. The method of claim 11, comprising a plurality of regularly spaced spacers.

19. The method of claim 11, comprising a plurality of irregularly spaced spacers.

20. A display package comprising:
    an array of interferometric modulators formed on a substrate;
    a backplate;

a seal disposed between the substrate and the backplate, wherein the substrate, backplate, and seal together package the array of interferometric modulators; and a means for preventing the array and the backplate from contacting each other disposed above the array and between the array and the backplate, wherein the preventing means does not contact one of the modulating means and the covering means.

21. The display package of claim 20, wherein the substrate is at least partially transparent and/or translucent, and the interferometric modulators are configured to reflect light through the transparent and/or translucent portion of the substrate.

22. The display package of claim 20, wherein the backplate comprises a recessed cap.

23. The display package of claim 20, wherein the backplate comprises a dessicant.

24. The display package of claim 20, wherein the means comprises a plurality of evenly spaced spacers.

25. The display package of claim 20, wherein the means comprises a plurality of irregularly spaced spacers.

26. A display package manufactured by a process comprising:

providing an interferometric modulator array on a substrate;

disposing one or more spacers above the array and between the array and a backplate, wherein the one or more spacers do not contact one of the array and the backplate; and sealing the backplate onto the substrate to form a display package, wherein at least one of the spacers prevents the backplate from contacting the array.

27. The display package of claim 26, wherein the substrate is at least partially transparent and/or translucent, and the interferometric modulators are configured to reflect light through the transparent and/or translucent portion of the substrate.

28. The display package of claim 26, comprising a plurality of regularly spaced spacers.

29. The display package of claim 26, comprising a plurality of irregularly spaced spacers.

30. The display package of claim 1, wherein the at least one spacer comprises at least one spacer designed to provide a graded response to an applied force.

31. The method of claim 11, wherein the one or more spacers comprise at least one spacer designed to provide a graded response to an applied force.

32. The display package of claim 20, wherein the preventing means is designed to provide a graded response to an applied force.

33. The display package of claim 26, wherein the one or more spacers comprise at least one spacer designed to provide a graded response to an applied force.

* * * * *

UNITED STATES PATENT AND TRADEMARK OFFICE
CERTIFICATE OF CORRECTION

PATENT NO. : 7,573,547 B2  Page 1 of 1
APPLICATION NO. : 11/108026
DATED : August 11, 2009
INVENTOR(S) : Palmateer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1019 days.

Signed and Sealed this

Seventh Day of September, 2010

David J. Kappos
*Director of the United States Patent and Trademark Office*